United States Patent
Yamazaki et al.

(10) Patent No.: US 7,635,861 B2
(45) Date of Patent: Dec. 22, 2009

(54) SEMICONDUCTOR DEVICE AND METHOD OF MANUFACTURING THE SAME

(75) Inventors: Shunpei Yamazaki, Tokyo (JP); Hisashi Ohtani, Tochigi (JP); Takeshi Fukunaga, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/275,850

(22) Filed: Jan. 31, 2006

(65) Prior Publication Data
US 2006/0145153 A1 Jul. 6, 2006

Related U.S. Application Data

(63) Continuation of application No. 09/898,986, filed on Jul. 3, 2001, now Pat. No. 7,037,765, which is a continuation of application No. 09/272,701, filed on Mar. 18, 1999, now Pat. No. 6,278,132, which is a continuation of application No. 08/890,591, filed on Jul. 8, 1997, now Pat. No. 6,031,249.

(30) Foreign Application Priority Data
Jul. 11, 1996 (JP) .................................. 8-201294

(51) Int. Cl.
H01L 21/00 (2006.01)
(52) U.S. Cl. ............................. 257/57; 257/59; 257/66
(58) Field of Classification Search .................. 257/57, 257/59, 66
See application file for complete search history.

(56) References Cited

U.S. PATENT DOCUMENTS

| | | | |
|---|---|---|---|
| 4,373,965 A * | 2/1983 | Smigelski ................... 438/449 |
| 4,393,572 A * | 7/1983 | Policastro et al. ........... 438/164 |
| 4,528,211 A * | 7/1985 | Bhagat ....................... 438/672 |
| 4,575,921 A * | 3/1986 | Bhagat ....................... 438/303 |
| 5,130,770 A * | 7/1992 | Blanc et al. ................. 257/347 |
| 5,550,397 A   | 8/1996 | Lifshitz et al. |
| 5,552,624 A   | 9/1996 | Shotnicki et al. |

(Continued)

FOREIGN PATENT DOCUMENTS

JP 63-237571 10/1988

(Continued)

OTHER PUBLICATIONS

Wang et al., Enhanced Performance of Accumulation Mode 0.5 μm CMOS/SOI Operated at 300 K and 85 K, *IEEE, IEDM 91*, pp. 679-682.

(Continued)

*Primary Examiner*—Laura M Menz
(74) *Attorney, Agent, or Firm*—Fish & Richardson P.C.

(57) ABSTRACT

A semiconductor device having a CMOS structure, wherein, in manufacturing a CMOS circuit, an impurity element which imparts p-type conductivity to the active layer of the p-channel type semiconductor device is added before forming the gate insulating film. Then, by applying thermal oxidation treatment to the active layer, the impurity element is subjected to redistribution, and the concentration of the impurity element in the principal surface of the active layer is minimized. The precise control of threshold voltage is enabled by the impurity element that is present in a trace quantity.

5 Claims, 16 Drawing Sheets

U.S. PATENT DOCUMENTS

| | | | |
|---|---|---|---|
| 5,569,615 | A | 10/1996 | Yamazaki et al. |
| 5,574,292 | A | 11/1996 | Takahashi et al. |
| 5,616,935 | A | 4/1997 | Koyama et al. |
| 5,659,192 | A | 8/1997 | Sarma et al. |
| 5,726,459 | A | 3/1998 | Hsu et al. |
| 5,739,549 | A | 4/1998 | Takemura et al. |
| 5,821,563 | A | 10/1998 | Yamazaki et al. |
| 5,863,823 | A * | 1/1999 | Burgener .................... 438/295 |
| 5,898,204 | A * | 4/1999 | Watanabe ................... 257/349 |
| 5,998,854 | A * | 12/1999 | Morishita et al. ........... 257/565 |
| 6,031,249 | A | 2/2000 | Yamazaki et al. |
| 6,077,731 | A | 6/2000 | Yamazaki et al. |
| 6,165,876 | A | 12/2000 | Yamazaki et al. |
| 6,180,957 | B1 * | 1/2001 | Miyasaka et al. ............. 257/57 |
| 6,218,219 | B1 | 4/2001 | Yamazaki et al. |
| 6,278,132 | B1 * | 8/2001 | Yamazaki et al. ............. 257/69 |
| 6,353,244 | B1 | 3/2002 | Yamazaki et al. |
| 6,362,027 | B1 | 3/2002 | Yamazaki et al. |
| 6,424,008 | B1 | 7/2002 | Yamazaki et al. |
| 6,465,287 | B1 * | 10/2002 | Yamazaki et al. .......... 438/162 |
| 6,478,263 | B1 * | 11/2002 | Yamazaki et al. ............. 257/51 |
| 6,504,174 | B1 * | 1/2003 | Yamazaki et al. ............. 257/64 |
| 6,528,358 | B1 * | 3/2003 | Yamazaki et al. .......... 438/151 |
| 6,528,820 | B1 * | 3/2003 | Yamazaki et al. ............. 257/66 |
| 6,541,315 | B2 | 4/2003 | Yamazaki et al. .......... 438/151 |
| 6,635,521 | B2 | 10/2003 | Zhang et al. |
| 6,680,223 | B1 | 1/2004 | Yamazaki et al. |
| 6,744,069 | B1 * | 6/2004 | Yamazaki et al. ............. 257/72 |
| 6,808,965 | B1 | 10/2004 | Miyasaka et al. |
| 6,830,617 | B1 * | 12/2004 | Ohtani et al. ................ 117/103 |
| 6,872,978 | B2 * | 3/2005 | Zhang et al. .................. 257/66 |
| 7,037,765 | B2 * | 5/2006 | Yamazaki et al. ........... 438/149 |
| 7,037,811 | B1 * | 5/2006 | Yamazaki et al. ........... 438/487 |
| 7,056,381 | B1 * | 6/2006 | Yamazaki et al. ............. 117/85 |
| 7,078,727 | B2 * | 7/2006 | Yamazaki et al. ............. 257/51 |
| 7,135,741 | B1 * | 11/2006 | Yamazaki et al. ........... 257/347 |
| 7,141,491 | B2 * | 11/2006 | Yamazaki et al. ........... 438/487 |
| 7,173,282 | B2 * | 2/2007 | Yamazaki et al. ............. 257/72 |
| 7,294,517 | B2 * | 11/2007 | Takayama et al. ............. 438/23 |
| 7,422,630 | B2 * | 9/2008 | Yamazaki et al. ............... 117/4 |
| 7,427,780 | B2 * | 9/2008 | Yamazaki et al. ............. 257/72 |
| 7,456,056 | B2 * | 11/2008 | Yamazaki et al. ........... 438/156 |
| 2001/0048115 | A1 * | 12/2001 | Yamazaki et al. ........... 257/154 |
| 2002/0098635 | A1 | 7/2002 | Zhang et al. |
| 2004/0063257 | A1 | 4/2004 | Zhang et al. |
| 2006/0145153 | A1 * | 7/2006 | Yamazaki et al. ............. 257/57 |
| 2008/0054267 | A1 * | 3/2008 | Imamura ....................... 257/72 |
| 2008/0093637 | A1 * | 4/2008 | Sankin et al. ................ 257/263 |
| 2008/0173969 | A1 * | 7/2008 | Hebert et al. ................ 257/488 |

FOREIGN PATENT DOCUMENTS

| | | |
|---|---|---|
| JP | 04-206971 | 7/1992 |
| JP | 04-286339 | 10/1992 |
| JP | 06-029476 | 2/1994 |
| JP | 06-204334 | 7/1994 |
| JP | 06204334 A * | 7/1994 |
| JP | 06-232059 | 8/1994 |
| JP | 06-260650 | 9/1994 |
| JP | 07-111331 | 4/1995 |
| JP | 07-169974 | 7/1995 |
| JP | 07-176753 | 7/1995 |
| JP | 07-321339 | 12/1995 |
| JP | 08-032081 | 2/1996 |
| JP | 08-064833 | 3/1996 |

OTHER PUBLICATIONS

Fossum et al., "Anomalous Leadage Current in LPCVD Polysilicon MOSFET's", *IEEE Transactions on Electron Devices*, vol. ED-32, No. 9; pp. 1878-1884, Sep. 1995.

Qian et al., "Inversion/Accumulation-Mode Polysilicon Thin-Film Transistors: Characterization and Unified Molding", *IEEE Transactions on Electron Devices*, vol. 35, pp. 1501-1509, Sep. 1988.

Malhi et al., "p-Channel MOSFET's in LPCVD Polysilicon", *IEEE Electron Device Letters*, vol. EDL-4, No. 10, pp. 369-371, Oct. 1983.

* cited by examiner

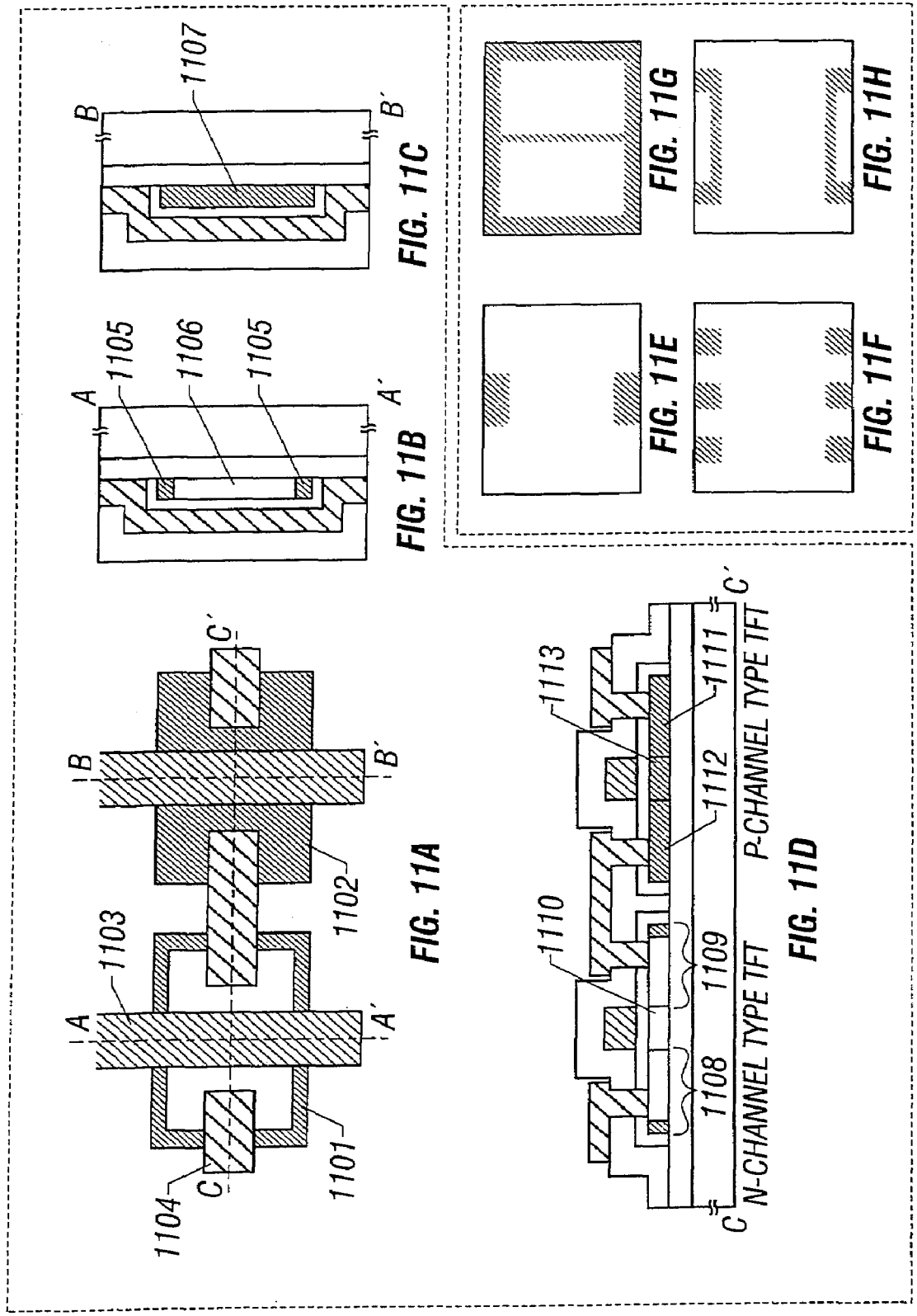

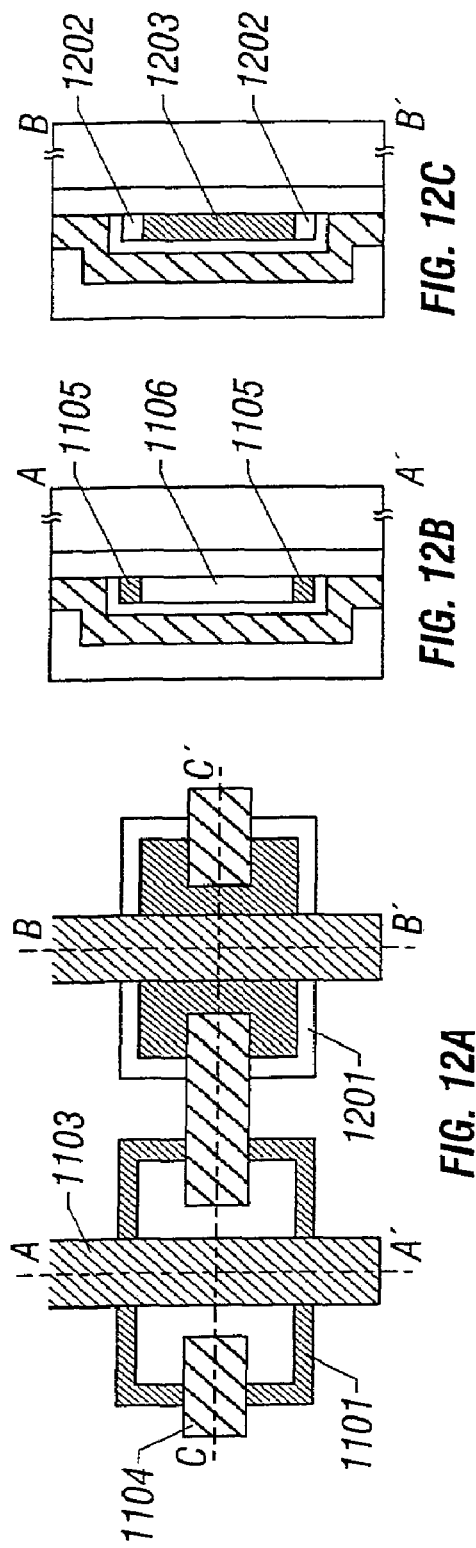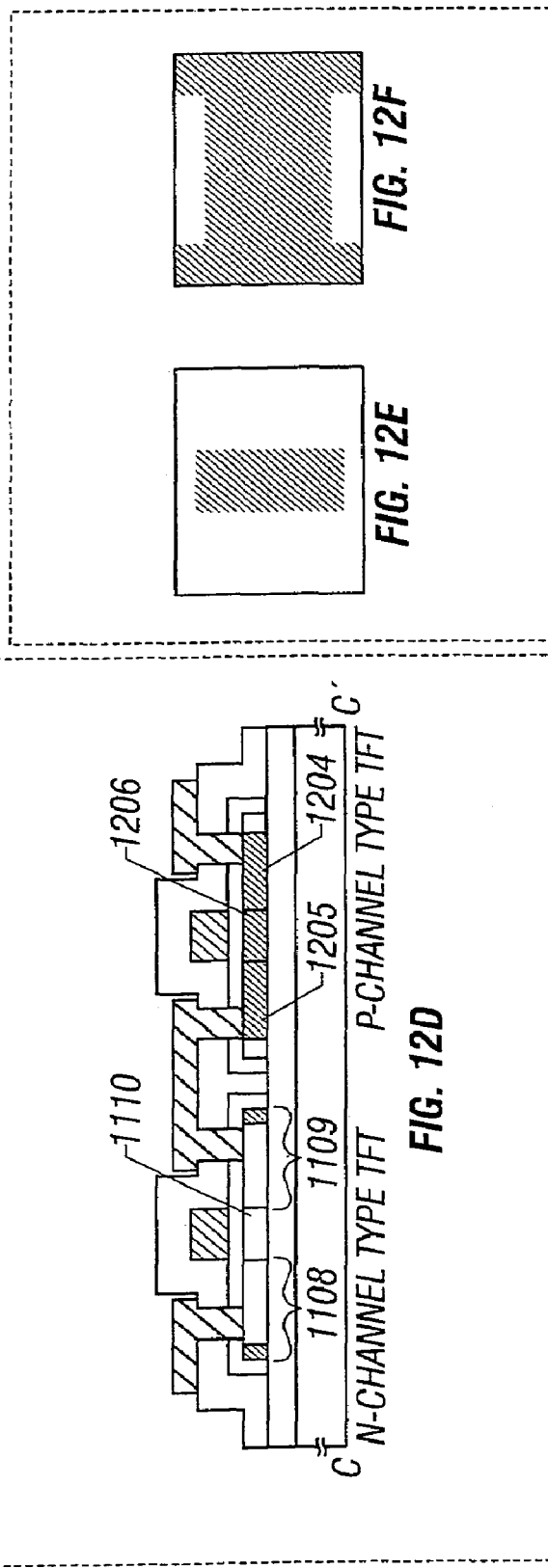

TFT SIZE Pch 3/20
(L/W [um]) Nch 3/20

|  | Oscillation Frequency (MHz) | | |
|---|---|---|---|
| (V) | 9 Pairs | 19 Pairs | 51 Pairs |
| 2.0 | 18.6 | 9.6 | 3.6 |
| 3.0 | 38.5 | 19.2 | 7.2 |
| 4.0 | 59.8 | 29.4 | 10.7 |
| 5.0 | 75.7 | 37.2 | 13.9 |
| 6.0 | 90.4 | 44.8 | 16.6 |
| 7.0 | 100.3 | 50.8 | 18.2 |
| 8.0 | 108.0 | 55.3 | 20.7 |
| 9.0 | 117.0 | 59.4 | 22.4 |
| 10.0 | 123.0 | 62.6 | 23.6 |

US 7,635,861 B2

SEMICONDUCTOR DEVICE AND METHOD OF MANUFACTURING THE SAME

BACKGROUND OF THE INVENTION

1. Field of the Invention

The present invention relates to a semiconductor device using a crystalline semiconductor (inclusive of a single crystal and a non-single crystal) formed on an insulating substrate such as a glass substrate, quartz substrate, silicon wafer, and the like, and to a method of manufacturing the same. More particularly, it relates to a case of constructing a CMOS circuit by using a n-channel type and a p-channel type semiconductor device in a complementary combination.

2. Description of the Prior Art

Recently, a technique for manufacturing a thin film transistor (TFT) on an inexpensive glass substrate is rapidly advancing. This rapid progress is caused of the growing demand on active matrix display devices. A display device of an active matrix(-addressing) type comprises pixels in a matrix-like arrangement, and a TFT (pixel TFT) is provided to each of the pixels to control the data signal individually by using the switching function of each of the pixel TFTs.

The gate signals and data signals sent to the pixel TFTs thus provided in a matrix-like arrangement are controlled by the peripheral drive circuit formed on the same substrate. A generally prevailed technique for manufacturing a CMOS circuit, i.e., a circuit in which a n-channel TFT and a p-channel TFT are combined in a complementary arrangement, is employed in constructing such a control circuit.

Further, in constructing the peripheral drive circuit described above, a circuit TFT capable of high speed operation is required. Accordingly, a crystalline silicon film is mainly used for the active layer. Because a carrier in a crystalline silicon film moves more rapidly than in an amorphous silicon film, a TFT having superior electric characteristics can be implemented by using the crystalline silicon film.

In this case, FIG. 1A is the cross sectional view of an example of a CMOS circuit constructed from top-gate type TFTs. Referring to FIG. 1A, a base film 102 is formed on the surface of a glass or quartz substrate 101. The structure also comprises a crystalline silicon film for an active layer 103 for a N-channel TFT, as well as another crystalline silicon film for an active layer 104 for a P-channel TFT.

The active layers described above are covered by a gate insulating film 105, and gate electrodes 106 and 107 are formed thereon. The gate electrodes 106 and 107 are further covered by an interlayer insulating film 108 which electrically insulates the gate electrode from the take out line.

Further, source electrodes 109 and 110 as well as a drain electrode 111, which are electrically connected to the active layers 103 and 104 via contact holes, are provided on the interlayer insulating film 108. Because the present case refers to a CMOS circuit, the drain electrode 111 is common for the n-channel TFT and the p-channel TFT. Finally, the source and the drain electrodes 109 to 111 are covered by a protective film 112 to provide a CMOS circuit as shown in FIG. 1A.

The structure shown in FIG. 1A is the simplest constitution of a CMOS circuit, and is an inverter which functions as a circuit for reversing the polarity of a signal. NAND circuit, NOR circuit, and far more complicated logic circuits can be realized by combining such simple CMOS circuits. Various types of electric circuits are designed in this manner.

However, as disclosed in Japanese Laid-open Patent Application No. 4-206971 and Japanese Laid-open Patent Application No. 4-286339, the CMOS circuits manufactured by using a crystalline silicon film suffered a problem that the electric characteristics of the n-channel TFT tend to shift in the direction of depression, whereas that of the p-channel TFT tend to shift in the direction of enhancement.

The electric characteristics (Id-Vg characteristics) of the TFT in the above case is shown in FIG. 1B. In FIG. 1B, the abscissa (Vg) shows the gate voltage, and the ordinate (Id) shows the drain current. The curve indicated by 113 shows the Id-Vg characteristics of the n-channel TFT, and that indicated by 114 shows the Id-Vg characteristics of the p-channel TFT.

The fact that the Id-Vg characteristics 113 of the n-channel TFT shift to the direction of depression and that the Id-Vg characteristics 114 of the p-channel TFT shift to the direction of enhancement both signify that, as shown in FIG. 1B, they are deviated to the negative side with respect to the gate voltage Vg.

Thus, it can be seen that the Id-Vg characteristics 113 and 114 of the n-channel and p-channel TFTs are asymmetrical with respect to the gate voltage of 0 V, and the absolute value of the threshold voltage of the n-channel TFT and that of the p-channel TFT become greatly differed from each other.

However, as disclosed in Japanese Laid Open Patent application No. 4-206971, a deviation in the output voltage due to the difference in the threshold voltage (drive voltage) of the n-channel TFT and that of the p-channel TFT is the cause of decreasing operation speed or malfunction of the CMOS circuit.

To overcome the above problems, the references described above disclose a method of controlling the threshold voltage by adding an impurity element to impart single conductivity to the channel region of the TFTs.

Still, however, in the technique described above (referred to hereinafter as "channel doping"), the control of the quantity of addition was found difficult with decreasing quantity to a trace amount. To the experimental knowledge of the present inventors, no change in threshold value was observed to a quantity of addition of about $1\times10^{18}/cm^3$, but upon exceeding the value, an abrupt change in threshold value was observed for a minute change in concentration.

For instance, in case the shift to be controlled in the threshold voltage is 1 V or lower, a shift in the order of several tenths of volts is realized by an extremely small amount of addition.

Thus, to control the threshold value with high precision, it was found indispensable to precisely control the concentration of the impurity element. However, the delicate control of the impurity element is technically very difficult. For instance, according to the experimental experience of the present inventors, no change in threshold value was observed to a quantity of addition of about $1\times10^{18}/cm^3$, but upon exceeding the value, an abrupt change in threshold value was observed for a minute change in concentration.

SUMMARY OF THE INVENTION

The present invention disclosed in the specification has been accomplished in the light of the aforementioned problems. It is therefore an object of the present invention to provide a technique for delicately control the threshold voltage by precisely controlling the concentration of the added impurity elements.

According to the present invention, a semiconductor device having a CMOS structure is characterized by comprising: an n-channel semiconductor device; a p-channel semiconductor device which is complementarily combined with said n-channel semiconductor device to form said CMOS structure; and a substrate having an insulating surface on which said n-channel semiconductor device and said p-channel semiconductor device are formed; wherein said p-channel semiconductor device has an active layer, only to which impurity elements that impart p-type conduction are intentionally added in a partial region of said active layer which includes at least a channel formation region; wherein the distribution of concentration of said impurity elements depthwise is continuously reduced toward a main surface of said active layer in the vicinity of the main surface of said active layer; and wherein said impurity elements remaining in the vicinity of the main surface of said active layer is used to control a threshold value voltage.

In the present invention, the concentration of the impurity ions for imparting p-type conductivity (representatively boron (B) ions) in the surface of the active layer (the surface on which the reverse layer is to be formed) is lowered by taking up the impurity element (representatively boron (B)) into the thermal oxidation film (gate insulating film) from the active layer. That is, in case of using the thermal oxidation film as the gate insulating film, B ions are taken thereinto at a concentration of from $1\times10^{17}$ to $1\times10^{20}/cm^3$.

In case of forming a crystalline silicon film by crystallizing an amorphous silicon film, the use of a catalytic element (metallic element) which accelerates the crystallization results in a crystalline silicon film containing the metallic element at a concentration of $5\times10^{18}/cm^3$ or lower. This value is for the case when the thermal oxidation treatment is performed under an atmosphere containing a halogen element. In such a case, the gate insulating film also takes up the metallic and the halogen elements. In particular, the halogen element is incorporated into the gate insulating film at a concentration of from $1\times10^{16}$ to $1\times10^{20}/cm^3$.

The metallic element referred above is one or more elements selected from the group consisting of nickel (Ni), cobalt (Co), platinum (Pt), copper (Cu), and iron (Fe), but representatively, Ni is used. The thermal oxidation treatment is performed at a relatively high temperature range of form 700 to 1,100° C., and as the halogen element, generally used are chlorine (Cl) and fluorine (F). In performing the thermal oxidation treatment, halogen elements are introduced into the processing atmosphere in the form of a gas containing the halogen element in the composition thereof; more specifically, gaseous HCl, $NF_3$, or $ClF_3$ is used.

According to another aspect of the present invention, a semiconductor device having a CMOS structure is characterized by comprising: an n-channel semiconductor device; a p-channel semiconductor device which is complementarily combined with said n-channel semiconductor device to form said CMOS structure; and a substrate having an insulating surface on which said n-channel semiconductor device and said p-channel semiconductor device are formed; wherein said p-channel semiconductor device has an active layer, to which impurity elements that impart p-type conduction are intentionally added in a region of said active layer which includes at least a channel formation region; wherein said n-channel semiconductor device has an active layer, to which impurity elements that impart n-type conduction are intentionally added in a region of said active layer which includes at least an edge portion; wherein the distribution of concentration of said impurity elements depthwise is continuously reduced toward a main surface of said active layer in the vicinity of the main surface of said active layer; and wherein said impurity elements remaining in the vicinity of the main surface of said active layer is used to control a threshold value voltage.

More specifically, it is characterized in that, in at least the region containing the channel region in the active layer of the P-channel semiconductor device described above, the edge portion is not included at least in the channel region.

According to still another aspect of the present invention, a method of manufacturing a semiconductor device is characterized by comprising the steps of: forming first and second active layers each formed of a crystalline silicon film on an insulating substrate; making only said first active layer include impurity elements that impart p-type conduction; and subjecting said first and second active layers to a thermal oxidization process to impart said impurity elements to the interior of a thermal oxide film formed on a surface of said first active layer; wherein the distribution of concentration of said impurity elements depthwise is continuously reduced toward a main surface of said active layer in the vicinity of the main surface of said active layer; and wherein said impurity elements remaining in the vicinity of the main surface of said active layer is used to control a threshold value voltage.

An object of the present invention is to manufacture, by using the manufacturing method of the constitution according to the present invention, a semiconductor device having a CMOS structure comprising an n-channel type semiconductor device and a p-channel type semiconductor device being combined in a complementary manner. In the constitution described above, the first active layer corresponds to the p-channel type semiconductor device, and the second active layer corresponds to the n-channel type semiconductor device.

According to yet another aspect of the invention, a method of manufacturing a CMOS type semiconductor device in which an n-channel semiconductor device and a p-channel semiconductor device are complementarily combined, is characterized by comprising the steps of: forming a first active layer formed of a crystalline silicon film including impurity elements that impart p-type conduction and a second active layer including no impurity elements on a substrate having an insulation surface; and subjecting said first and second active layers to thermal oxidization process to form a thermal oxide film; wherein said first active layer forms said p-channel semiconductor device, and said second semiconductor device forms said n-channel semiconductor device; wherein said impurity elements contained in the interior of said first active layer are taken in the interior of said thermal oxide film through said thermal oxidation process; wherein the concentration of said impurity elements in the main surface of said active layer is reduced; and wherein said impurity elements remaining in the main surface of said active layer is used to control a threshold value voltage.

According to further another aspect of the present invention, a method of manufacturing a CMOS type semiconductor device in which an n-channel semiconductor device and a p-channel semiconductor device are complementarily combined, is characterized by comprising the steps of: forming a first active layer and a second active layer each formed of a crystalline silicon film including impurity elements that impart p-type conduction on a substrate having an insulation surface; and subjecting said first and second active layers to thermal oxidization process to form thermal oxide films; wherein said first active layer forms said p-channel semiconductor device, and said second semiconductor device forms said n-channel semiconductor device; wherein said impurity elements contained in the interior of said first active layer are taken in the interior of said thermal oxide film through said thermal oxidation process; wherein the concentration of said impurity elements in the main surface of said active layer is reduced; and wherein said impurity elements remaining in the main surface of said active layer is used to control a threshold value voltage.

By implementing the invention of the constitution described above, the conventional channel doping technique can be effected further precisely. This technique can be achieved in the constitution comprising adding B ions into the p-channel type semiconductor device, and this technique utilizes the physical phenomenon; i.e., that the concentration of B ions reduces in the vicinity of the Si/SiO$_2$ interface (active layer side) of the channel region.

BRIEF DESCRIPTION OF THE DRAWINGS

FIGS. 11A to 11H show the constitution of an active layer in a CMOS;

FIGS. 12A to 12F show the constitution of an active layer in another CMOS;

DETAILED DESCRIPTION OF THE PREFERRED EMBODIMENTS

The present invention is described in detail referring to the preferred embodiments according to the present invention. It should be understood, however, that the present invention is not to be construed as being limited to the examples below.

EXAMPLE 1

Figure 1A:
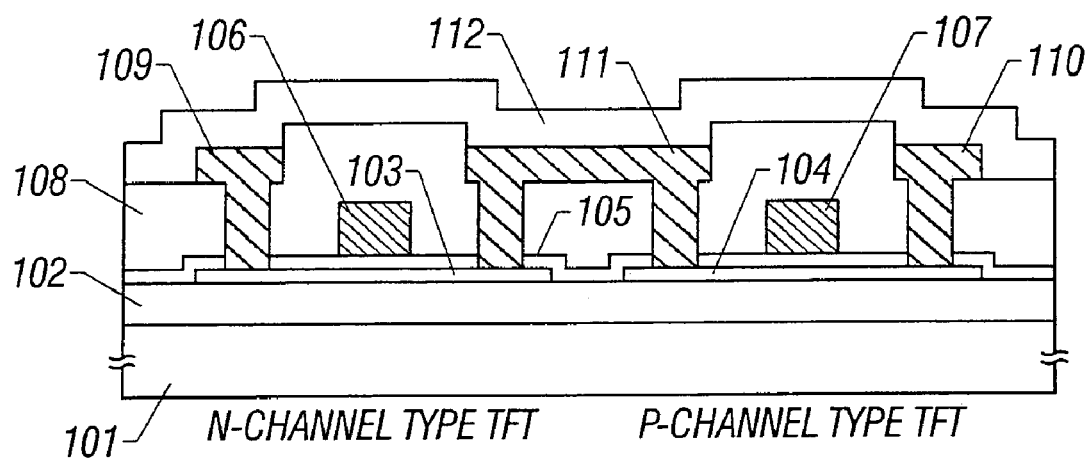
FIGS. 1A and 1B are diagrams showing the structure and characteristics of a thin film transistor.
Figure 1B:
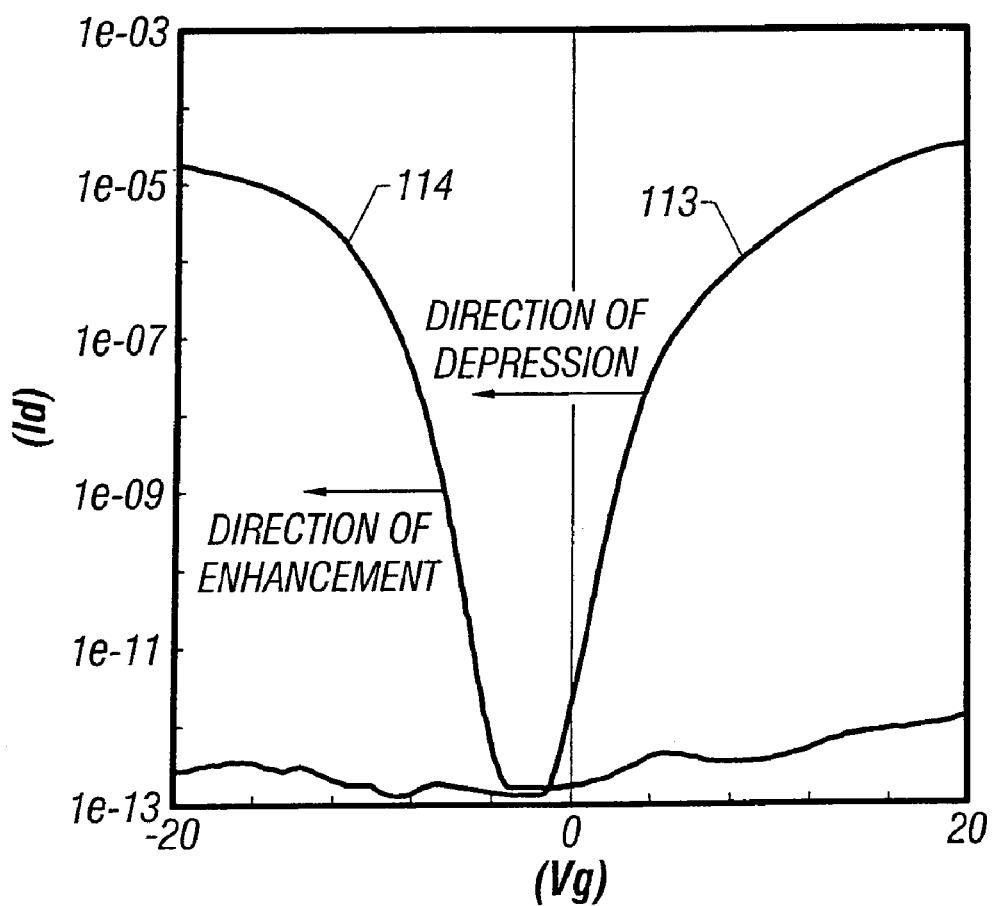

The present example refers to a case of manufacturing a CMOS circuit comprising an n-channel type TFT and a p-type TFT combined in a complementary constitution according to the present invention. Referring to FIG. 1A, the CMOS circuit manufactured in this example is an inverter circuit of a simplest constitution. In the present circuit, 13 (boron) ions are added into the P-channel TFT alone to control the threshold voltage. The circuit is described in detail below by referring to FIGS. 2A to 2E and FIGS. 3A to 3D.

Figure 2A:
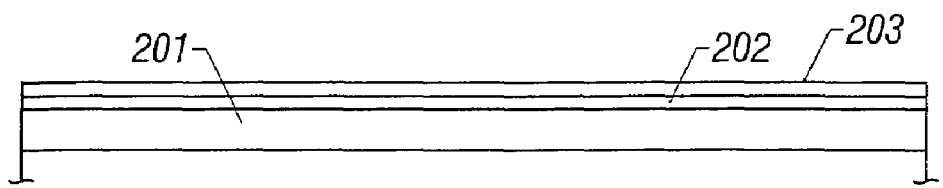
FIGS. 2A to 2E are diagrams showing the steps of manufacturing a thin film transistor.
Figure 2B:
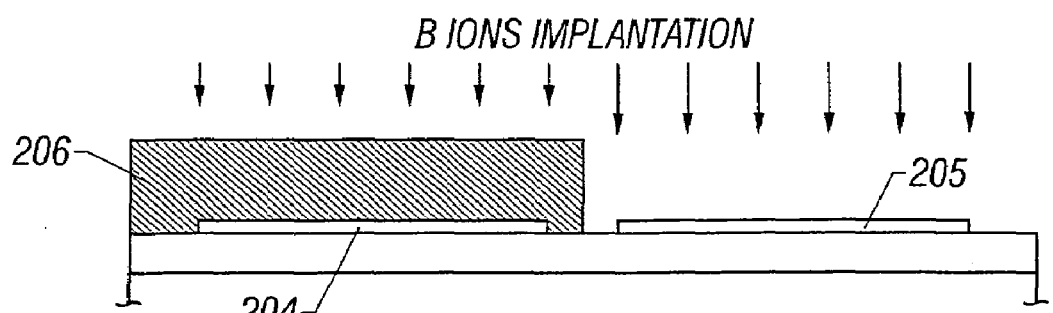

Referring to FIG. 2A, a silicon oxide film is formed by deposition as a underlying film 202 on the surface of a substrate 201. The substrate can be selected from glass substrates, quartz substrates, silicon substrates (wafers), etc., in view of the heat resistance in the later thermal oxidation steps. Thus, a quartz substrate was selected for the substrate 201.

A crystalline silicon film is formed thereafter to provide an active layer of the TFT. There are various methods to obtain the crystalline silicon film, but in the present example, an amorphous silicon film is first deposited to a thickness of from 100 to 3,000 Å, preferably, from 100 to 1,000 Å, and representatively, from 200 to 500 Å, by using reduced pressure thermal CVD or plasma CVD, and is then crystallized by means of an annealing process using an excimer laser. Employable as the excimer laser is an ultraviolet radiation using KrF, XeCl, etc., as the excitation gas.

Otherwise, the crystallization of the amorphous silicon film can be effected by a heating process or means using both heating and laser annealing processes. For instance, an effective method comprises subjecting the amorphous silicon film to solid-phase growth process by applying heat treatment at a temperature of about 600° C., followed by laser annealing to improve the crystallinity thereof.

Once the crystalline silicon film 203 is obtained by utilizing the technique described above, patterning is effected to form an island-like semiconductor layer 204 which later constitutes an active layer of the n-channel TFT, and another island-like semiconductor layer 205 which later constitutes an active layer of the p-channel TFT.

Then, after a resist mask (not shown) for use in the patterning of the island-like semiconductor layers 204 and 205 is removed by using a specified stripping solution, a resist mask 206 covering the island-like semiconductor layer 204 which becomes the active layer of the n-channel TFT is formed again. Then, B ions, which are impurity elements for imparting p-type conductivity are added to the island-like layer 205 alone (channel doping step).

In the present example, B ions that are obtained by mass separation are implanted by ion implantation at a concentration of from $1\times10^{16}$ to $1\times10^{19}$/cm$^3$. This method enables selective addition of B ions alone, and is therefore advantageous in controlling the quantity of addition (addition concentration). Plasma doping can be mentioned as an alternative method for ion implantation, but without using mass separation. In case such a means is used, a diffusion step must be incorporated because B ions are added as clusters together with other atoms and molecules.

The optimum quantity of adding B ions (addition concentration) must be determined experimentally because it differs depending on how threshold voltage (Vth) changes. In the constitution according to the present invention, the concentration of B ions in the vicinity of the Si/SiO$_2$ interface in the channel forming, region is determined after the step of thermal oxidation which appears later. The addition concentration must be controlled, taking this fact into consideration.

The present example refers to a case of adding B ions by means of ion implantation. Otherwise, a gas containing B ions (e.g., diborane) may be used as the gaseous starting material to add B ions during the film deposition of amorphous silicon. However, care must be taken in such a case because the threshold voltage of the n-channel TFT also shifts to the positive side.

After the step of adding B ions is completed, thermal oxidation process is effected to the island-like semiconductor layers 204 and 205. As means of thermal oxidation, a known oxidation technique such as dry $O_2$ oxidation, wet $O_2$ oxidation, and pyrogenic oxidation may be used. The oxidation method using gaseous $NF_3$ as the atmospheric gas is applicable to a glass substrate because thermal oxidation film is available at a relatively low temperature of from 500 to 700° C.

Figure 4:
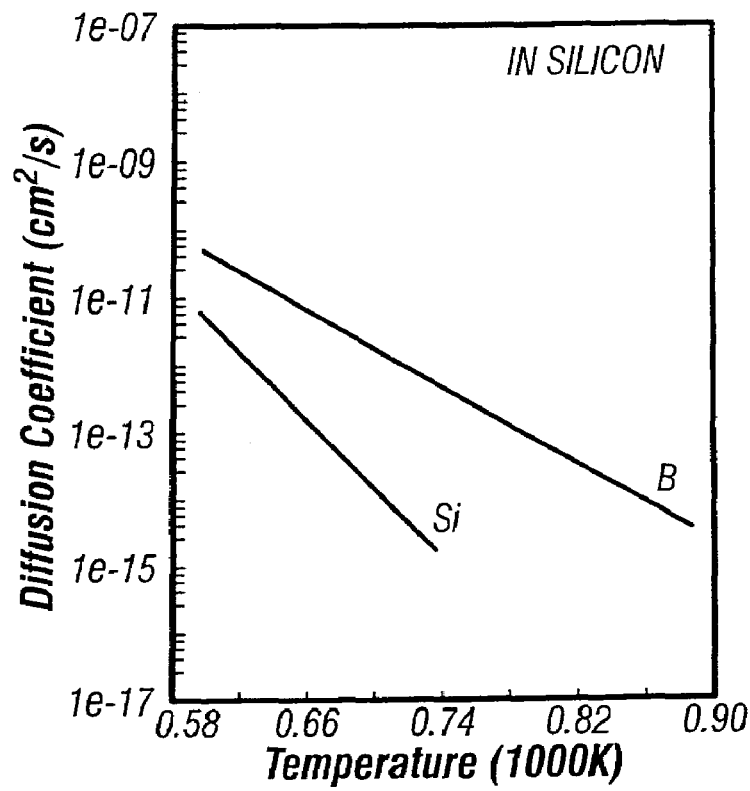
FIG. 4 is a graph showing the change of diffusion coefficient in relation with temperature.

The object of the thermal oxidation step in the present example is to lower (or control) the concentration of B ions at the $Si/SiO_2$ interface by introducing B ions into the thermal oxidation film. FIG. 4 shows the change of diffusion coefficient of silicon and boron with changing temperature.

Referring to FIG. 4, in silicon, the diffusion coefficient of boron does not greatly differ from that of silicon (when compared to that of metallic elements). It can be seen therefrom that boron is not a readily diffusible substance. If the thermal oxidation process is performed at 950° C., for instance, the diffusion coefficient of boron is as low as approximately $4 \times 10^{-14}$ cm$^2$/s. This fact shows that a concentration gradient is clearly observed in case redistribution of B ions occur at the interface between the silicon film and the thermal oxidation film.

How the concentration distribution of B ions in the vicinity of the $Si/SiO_2$ interface changes after the thermal oxidation process is illustrated in FIG. 5. For comparison, the same for P ions are also given in FIG. 5.

Referring to FIG. 5, it can be seen that the ions (B and P) doped into Si undergo redistribution when an oxide film is formed. This phenomenon occurs due to the difference in solubility and diffusion rate of the ions doped into Si and $SiO_2$. The equilibrium segregation coefficient m is defined by:

$$m = [C]_{Si}/[C]_{SiO2}$$

where $[C]_{Si}$ and $[C]_{SiO2}$ represent the solubility of the added ions in Si and $SiO_2$, respectively.

The segregation of added ions in the vicinity of $Si/SiO_2$ interface depends on the value of m. In general, the diffusion coefficient of an added ion in Si is sufficiently large; when m is lower than 1, the added ions are introduced into by $SiO_2$ (see FIG. 5A). When m is greater than 1, $SiO_2$ repels the added ions, and, as a result, the concentration of the added ions increases in the vicinity of the $Si/SiO_2$ interface (see FIG. 5B).

Figure 5A:
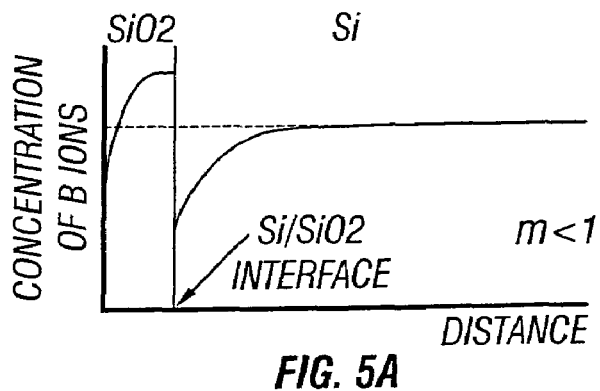
FIGS. 5A and 5B are diagrams showing the distribution of a dopant at the Si/SiO$_2$ interface.

The literature value of m for B ions is about 0.3, and that for P ions is about 10. Thus, a concentration distribution for B ions as shown in FIG. 5A is obtained after the thermal oxidation process. It can be seen therefrom that B ions are introduced into the thermal oxidation films 207 and 208, and the B ion concentration for the island-like semiconductor layer 205 in the vicinity of $Si/SiO_2$ interface becomes extremely low.

This signifies that a delicate control of the threshold voltage is possible by controlling the concentration of the B ions in the vicinity of the principal surface of the active layer in the channel forming region (the side of the region in which the reverse layer is actually formed), because, in case the island-like semiconductor layer 205 comes to function as an active layer for TFT in the later stages, the B ion concentration in that region is considerably minimized. Thus, in the inside of the active layer 205, the concentration of B ions tends to decrease with approaching interface with the gate insulating film 208.

Figure 5B:
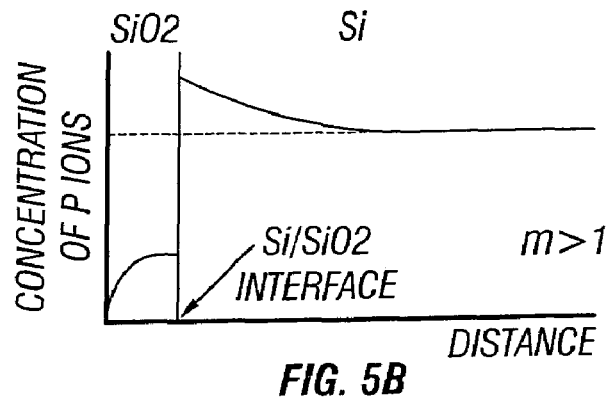

On the contrary, delicate control of the threshold voltage is not possible in case P ions are used as the doping ions, because, as shown in FIG. 5B, the concentration of P ions increases in the vicinity of $Si/SiO_2$ as shown in FIG. 5B.

The thermal oxidation process is effective for making the concentration of the doped ions (B ions) uniform in the principal surface of the active layer. This effect is advantageous in the following points.

Figure 8A:
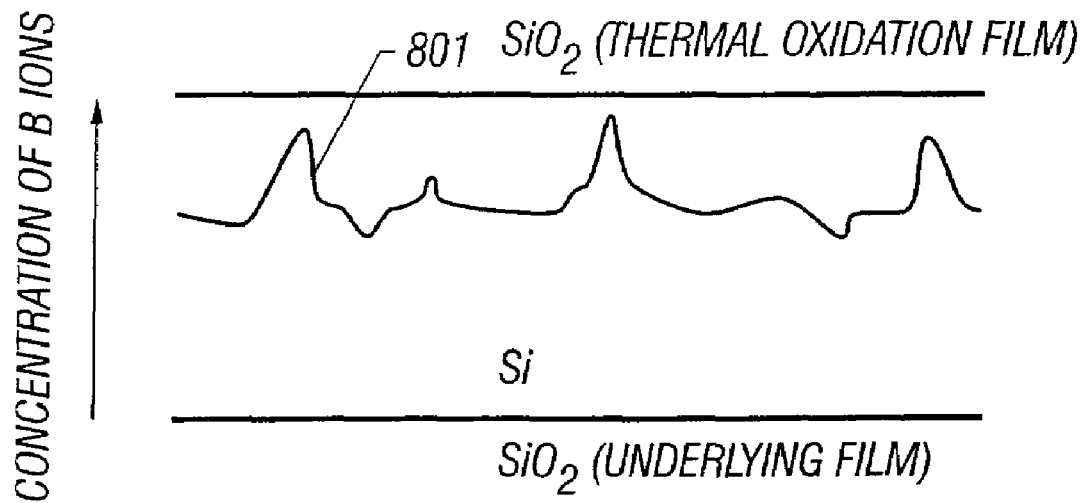
FIGS. 8A and 8B are other diagrams showing the distribution of a dopant at the Si/SiO$_2$ interface.
Figure 8B:
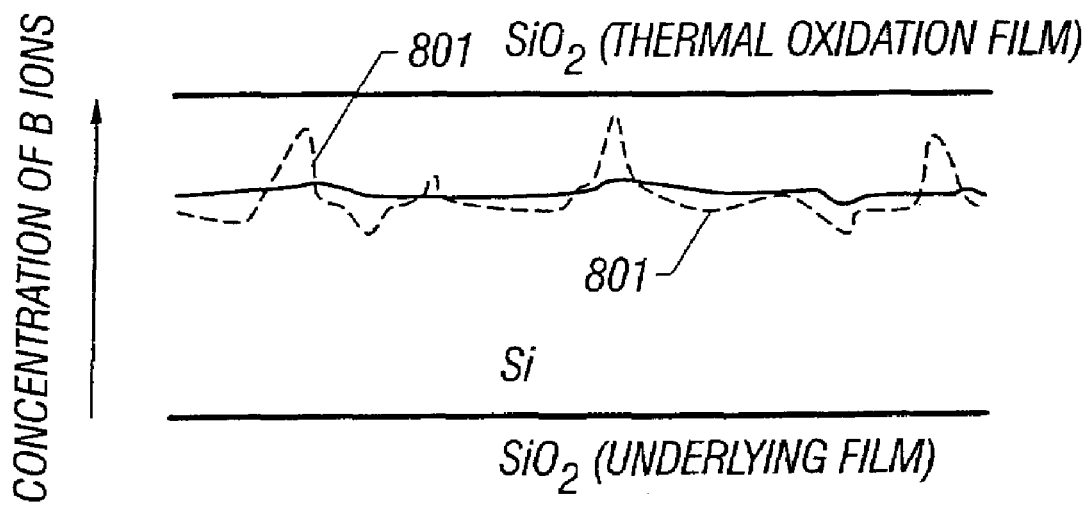

Referring to FIG. 8A, for instance, the concentration profile 801 for the B ions doped by means of ion implantation or plasma doping shows a heterogeneous distribution state in the depth direction of the active layer. In particular, the plasma doping method is effective for forming a shallow doped region, but has difficulties in achieving a uniform distribution. FIGS. 8A and 8B show the distribution depth for a desired in-plane direction at an arbitrary depth.

More specifically, fluctuation in concentration is formed in the in-plane direction (as a matter of course, also in the depth direction) in the vicinity of the principal surface of the active layer, and this fluctuation is reflected to the band state of the channel forming region so as to finally cast an influence to cause fluctuation of the threshold value among the semiconductor devices.

However, in the case of the present example, the fluctuation in concentration as a whole is reduced after a thermal oxidation process is performed, because diffusion occurs to some extent when B ions undergo redistribution. That is, referring to FIG. 8B, the B ions in the region of high concentration are preferentially introduced into the thermal oxidation film as to sufficiently lower the concentration. On the other hand, the concentration of B ions in the region of low concentration increases by the diffusion of the ions, and when the concentration becomes so high as to exceed a certain level, the ions are taken up by the thermal oxidation film.

Thus, as a whole, the concentration profile 802 of B ions remaining on the principal surface of the active layer yields a state with approximately uniform concentration distribution. As described in the foregoing, the effect of extracting B ions by thermal oxidation not only is effective for the improvement of increasing uniformity in concentration distribution, but also contributes for the delicate control of the threshold voltage.

In the present example, furthermore, the 500 Å thick thermal oxidation film formed in the thermal oxidation process is used as the gate insulating film. In case the thermal oxidation film is used as the gate insulating film, the interface state and the like in the vicinity of the $Si/SiO_2$ interface can be reduced. Accordingly, a TFT having extremely excellent electric characteristics can be obtained. Moreover, the film thickness can be controlled by changing the temperature, duration, and the atmosphere during the thermal oxidation process.

In the present example, furthermore, the thermal oxidation process is performed at a relatively high temperature of 950° C. Thus, an additional effect of considerably improving the crystallinity of the island-like semiconductor layers 204 and 205 is also expected.

Figure 2C:
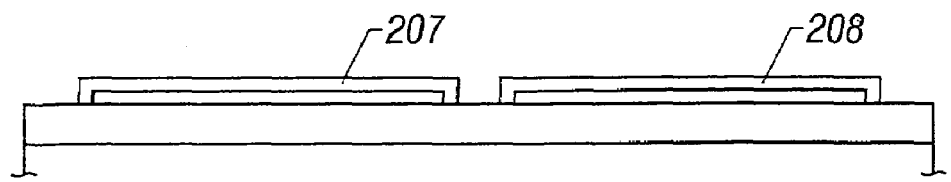

Once a state shown in FIG. 2C is obtained by completing the thermal oxidation process, an aluminum film (not shown) for use in constituting a gate electrode in the later steps is formed by means of sputtering or electron beam vapor deposition. Scandium is added to the aluminum film at a concentration of 0.2% by weight to suppress the generation of hillocks and whiskers.

Hillocks and whiskers are prickly or acicular protrusions attributed to an abnormal growth of aluminum. Hillocks and whiskers are the cause of forming short circuits and cross talks between neighboring lines or superposed lines.

Instead of the aluminum film, also usable are the films of anodically oxidizable metals such as tantalum, molybdenum, etc. A silicon film rendered electrically conductive can be used as well.

After the formation of the aluminum film, anodic oxidation using the aluminum film as the anode is effected in an electrolytic solution to form a thin and dense anodic oxide film on the surface of the aluminum film. The anodic oxide film thus obtained increases the adhesivity of the resist mask to the aluminum film in case of performing patterning.

Resist masks 209 and 210 are formed thereafter. Then, the aluminum film (not shown) is patterned by using the resist masks 209 and 210 to form aluminum film patterns 211 and 212 to provide the protocol of the gate electrodes. Thus is obtained a structure shown in FIG. 2D.

Subsequently, in accordance with the conditions disclosed in Japanese Laid-open Patent Publication No. 7-169974, porous anodic oxide films 213 and 214 are formed on the sides of the aluminum film patterns 211 and 212. In the present example, the porous anodic oxide films 212 and 214 are formed at a film thickness of 0.7 μm. Thus is obtained a state shown in FIG. 2E.

Then, after removing the resist masks 209 and 210, dense and robust anodic oxide films 215 and 216 are formed in accordance with the conditions disclosed in Japanese Laid-open Patent Application No. 7-169974. In the present example, however, the target voltage is controlled in such a manner that a film 700 Å in thickness is obtained. Gate electrodes 21 and 22 are thus established in this step. The resulting structure is shown in FIG. 3A.

Figure 3A:
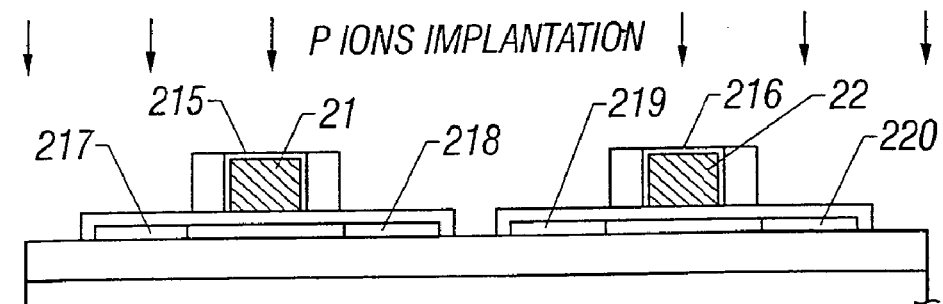
FIGS. 3A to 3D are diagrams showing the steps of manufacturing a thin film transistor.

Referring to FIG. 3A, as an impurity for imparting n-type conductivity, P ions are added to the entire surface. The P ions are doped by means of plasma doping or ion doping, and at a dose as high as in a range of from $0.2 \times 10^{15}$ to $5 \times 10^{15}/cm^2$, preferably, from $1 \times 10^{15}$ to $2 \times 10^{15}/cm^2$.

Thus are obtained regions 217 to 220 each containing heavily implanted P ions by performing the step shown in FIG. 3A. These regions function later as source/drain regions (FIG. 3A).

Then, after removing the porous anodic oxide films 213 and 214 by using a mixed acid solution containing mixed acetic acid, nitric acid, and phosphoric acid, a resist mask 221 is formed in such a manner that it may cover the element constituting the right side p-channel type TFT. Subsequently, P ions are implanted again in this state, but at a lower dose in a range of from $0.1 \times 10^{14}$ to $5 \times 10^{14}/cm^2$, preferably, from $0.3 \times 10^{14}$ to $1 \times 10^{14}/cm^2$ (FIG. 3B).

Figure 3B:
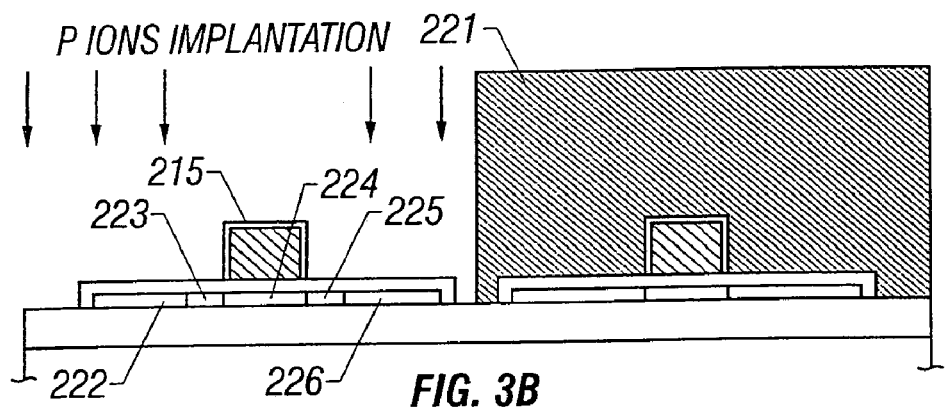

More specifically, the P ions implanted in the step with reference to FIG. 3B are at a dose lower than that of ion implantation performed in the step illustrated by FIG. 3A. Thus are obtained lightly doped low concentration impurity regions 223 and 225. The regions 222 and 226 become high concentration impurity regions heavily implanted with P ions.

Upon completion of the present step, the region 222 becomes the source region of an n-channel type TFT. Also obtained through the present step are the low concentration impurity region 223 and 225, and a drain region 226. The region 324 is a substantially intrinsic channel region. The region 225 is the region generally called as an LDD (lightly doped drain) region.

Although not specifically shown in the figure, the region shielded by the anodic oxide film 215 during ion implantation is formed between the channel region 224 and the low concentration impurity regions 223 and 225. This region is called as an "offset region", and is formed at a distance corresponding to the film thickness of the anodic oxide film 215.

The offset gate region is not subjected to ion implantation and is therefore substantially intrinsic. However, it does not form a channel but functions as a resistor component that relaxes the electric field intensity and suppresses the deterioration, because no gate voltage is applied. In case the distance (offset width) is short, however, it does not function as a practically effective offset region. In the present example, this region does not function as an offset region because the width is 700 Å.

Figure 3C:
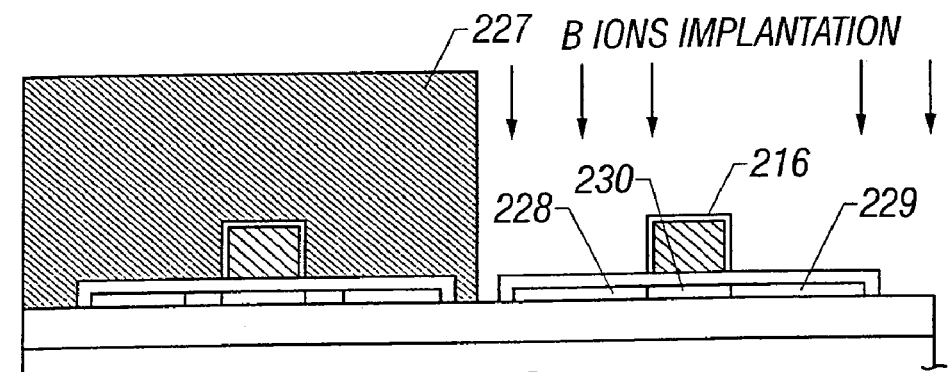

Then, referring to FIG. 3C, the resist mask 221 is removed, and another resist mask 227 is formed to cover the left side n-channel TFT. Subsequently, B (boron) ions are implanted as an impurity for imparting p-type conductivity. The B ions are implanted at a dose of from $0.2 \times 10^{15}$ to $10 \times 10^{15}/cm^2$, preferably, from $1 \times 10^{15}$ to $2 \times 10^{15}/cm^2$. The dose at this step is about the same as that in the step with reference to FIG. 3A.

By effecting this step, the conductivity of the high concentration impurity regions 219 and 220 is reversed from n-type to p-type to form a source region 228 and a drain region 229 for the p-channel TFT. A channel region 230 is formed right under the gate electrode 22. The channel forming region 230 contains B ions added in the channel doping step, but the concentration of the B ions in the vicinity of the $Si/SiO_2$ decreases with approaching the interface.

Upon completion of the step illustrated in FIG. 3C, the resist mask 227 is removed, and an excimer laser is irradiated to the resulting structure to activate the impurity elements (P and B ions) and to recover the damage the island-like semiconductor layer has received. The irradiation energy is in the range of from 200 to 250 $mJ/cm^2$.

Figure 3D:
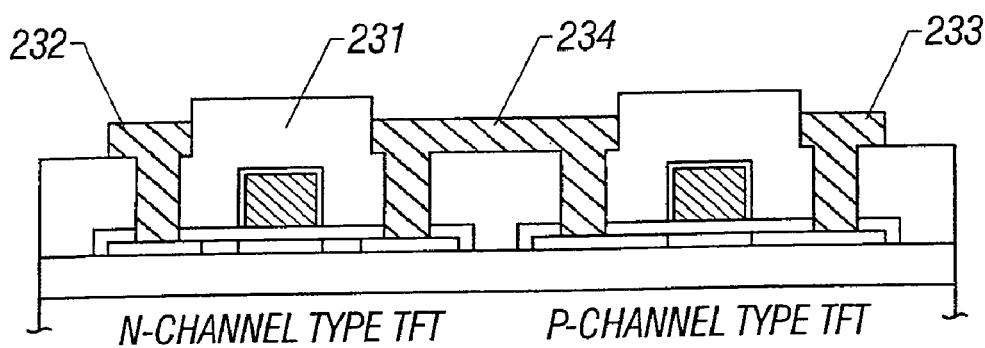

When the irradiation of the excimer laser is completed, the interlayer insulating film 231 is formed at a thickness of 4,000 Å as shown in FIG. 3D. The interlayer insulating film 231 can be formed by using any of the silicon oxide film, silicon oxynitride film, and silicon nitride film, or by using a multi-layered structure thereof. Those silicide films can be formed by means of plasma CVD or thermal CVD. A transparent organic resin (e.g., polyimide) film can be used as well.

Contact holes are perforated thereafter to form a source electrode 232 for the n-channel TFT and another source electrode 233 for the p-channel TFT. Thus, a CMOS structure can be implemented by providing a drain electrode 234 in such a constitution that is shared by the n-channel TFT and the p-channel TFT (FIG. 3D).

Although the present example specifically refers to a case of constructing a CMOS circuit by forming TFTs on a quartz substrate, the same is readily applicable to a MOSFET formed on a silicon wafer. More specifically, the IC technology is also an application field of the present invention.

Figure 6:
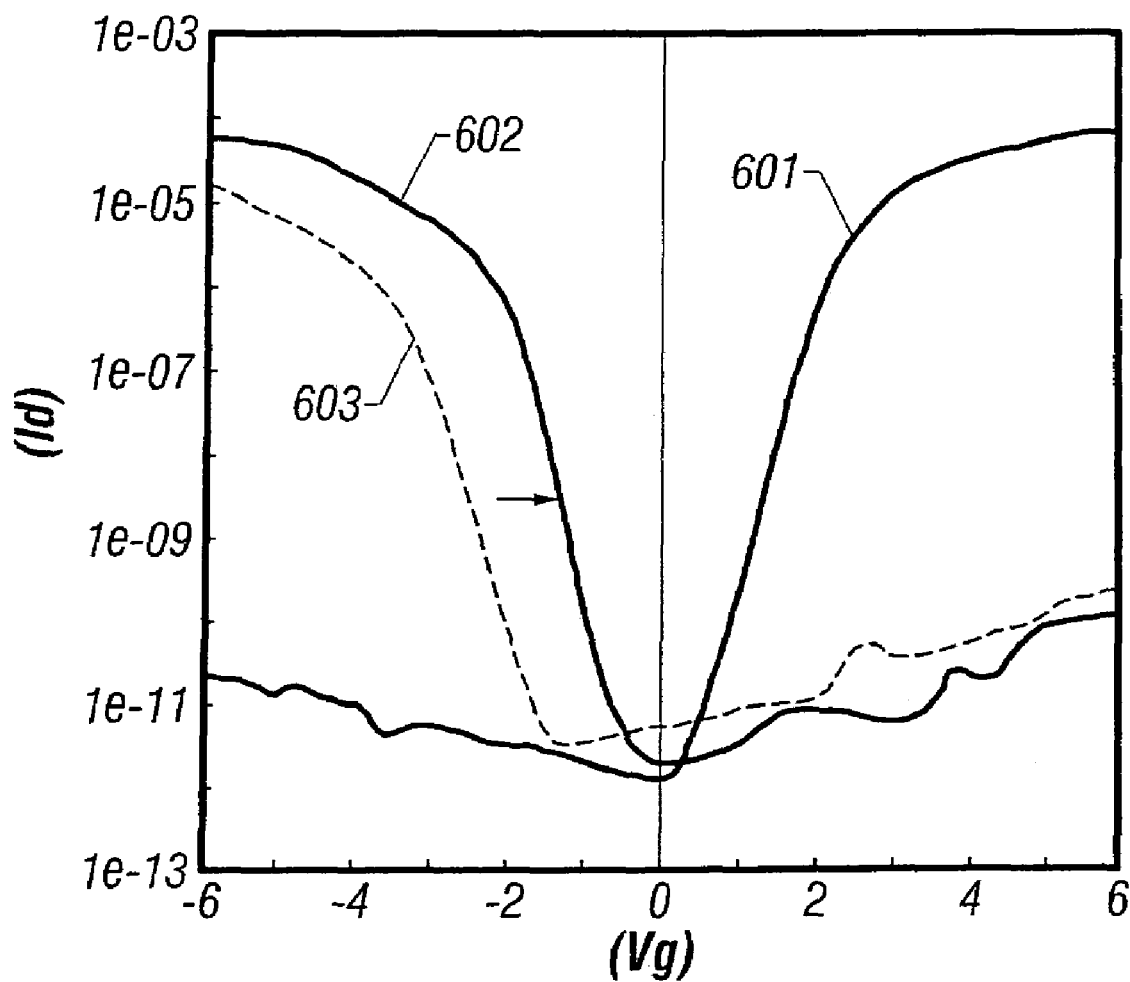
FIG. 6 is a graph showing the characteristics of a thin film transistor.

FIG. 6 shows the electric properties (Id-Vg characteristics) of the TFT thus manufactured in accordance with the present example as shown in FIG. 3D. Referring to FIG. 6, the solid line curves indicated by 601 and 602 each show the Id-Vg characteristics of the n-channel TFT and the p-channel TFT, respectively. The curve shown by broken lines 603 shows the Id-Vg characteristics of a p-channel TFT obtained without employing the constitution according to the present invention. In the graph, the abscissa shows the gate voltage (Vg) and the ordinate shows the drain current (Id) of the TFT.

The threshold voltage Vth,n as calculated from the Id-Vg characteristics 601 for the n-channel TFT manufactured in accordance with the present example fell within a range of from 0.1 to 0.5 V, and the same Vth,p calculated from the Id-Vg characteristics 602 for the p-channel TFT manufactured in accordance with the present example fell within a range of from −0.5 to −0.1 V.

When compared with the Id-Vg characteristics 603 for a conventional example, the Id-Vg characteristics 602 using the present example is clearly shifted to the positive direction (the direction shown by an arrow). The threshold voltage obtained from the Id-Vg characteristics 603 was in a range of from about −1.5 to −1.0 V. Thus, it can be seen that the shifted value is as subtle as about several tenth of a voltage, and that a precise control never realized by a conventional channel doping technology.

The aforementioned fact illustrates the distinguished feature of the present invention that it enables an extremely precise control in channel doping. Furthermore, the present invention is particularly effective for the case of a TFT having a sufficiently low threshold voltage without performing channel doping.

Furthermore, as shown in the constitution of the present example, it is greatly meaningful to add B ions into the n-channel TFT alone. This is described in further detail below.

In general, the gap (difference) between the threshold voltage (Vth,n) of the n-channel TFT and that (Vth,p) of the p-channel TFT is referred to as "window". Furthermore, as described in Japanese Laid-open Patent Application No. 4-206971, it is known that a CMOS circuit suffers lowering of operation speed or mal-function when the right side and the left side of the window is not symmetrical with respect to the gate voltage of 0 V; i.e., when the absolute value for Vth,n differs from that for Vth,p.

Generally, when a crystalline silicon film is used for the active layer, the Id-Vg characteristics tend to shift to the negative side with respect to the gate voltage. Thus, in general, the threshold value is controlled by adding an impurity to impart p-type conductivity to the n-channel TFT. However, this method increases the width of the window, thereby increasing the range of voltage to be applied to the gate electrode.

The above signifies that the drive voltage of the gate electrode becomes high to increase the power consumption. Moreover, in order to operate a high speed CMOS circuit at a high drive voltage, a high reliability on the circuit with superior resistance to degradation must be realized. This requires the fabrication of a TFT having a higher performance.

However, as described above, the width of the window can be narrowed by controlling the threshold voltage of the p-channel TFT alone in accordance with the present example; thus, the power consumption can be reduced. Particularly, by following the manufacturing method according to the present example, the window threshold can be narrowed within a range of from 0.2 to 1 V. Thus, the present example not only lowers the power consumption, but also a CMOS circuit with high reliability can be implemented.

As described in the foregoing, the threshold voltage of the p-channel TFT alone is controlled by performing channel doping. Accordingly, the width of the window can be narrowed and a well-balanced Id-Vg characteristics can be realized. The most distinguished feature of the present example is, in particular, the concentration of additional ions in the vicinity of the Si/SiO$_2$ interface of the channel forming region is lowered by allowing the ions to redistribute after the channel doping step. This enables delicate control of the threshold voltage. Thus, as described above, the present example is a very effective means when minimum threshold voltage and channel doping with extremely delicate control in precision are required to the circuit.

EXAMPLE 2

In Example 1, the channel doping step is performed immediately after the formation of an island-like semiconductor layer. However, the channel-doping step can be effected between other steps. For instance, doping can be carried out on an amorphous silicon film before it is crystallized, or on a crystalline silicon film before it is patterned into an island-like semiconductor layer. In case of performing doping on an amorphous silicon film, in particular, ion implantation method without using mass separation (in which the ions to be added are implanted in the form of clusters) can be performed without any problem because the doped ions are allowed to diffuse uniformly into the film during the crystallization.

Otherwise, for instance, ions may be added into the crystalline silicon film before or after its patterning, and after allowing the ions to diffuse by thermal diffusion or laser annealing, thermal oxidation can be carried out.

As described above, the order of performing the channel doping step can be properly modified by taking the other steps into consideration. Basically, fine control of the concentration of the added ions is effected finally in the thermal oxidation step. Thus, the only requirement is that a necessary quantity of additional ions is incorporated into the island-like semiconductor layer before the thermal oxidation step.

EXAMPLE 3

In Example 1, FIGS. 5A and 5B show the redistribution tendency of substances having a low diffusion rate. The diffusion rate for P and B ions is approximately the same, and is sufficiently low as explained with reference to FIG. 4. However, the behavior in redistribution changes with increasing diffusion rate of the added ions to a sufficiently high value.

For instance, when the diffusion rate of B ions becomes high, the ions exhibit a distribution state differed from that shown in FIG. 5A. In fact, it is reported that the diffusion rate of B ions increases when the thermal oxidation step is carried out under an atmosphere containing hydrogen.

Figure 7:
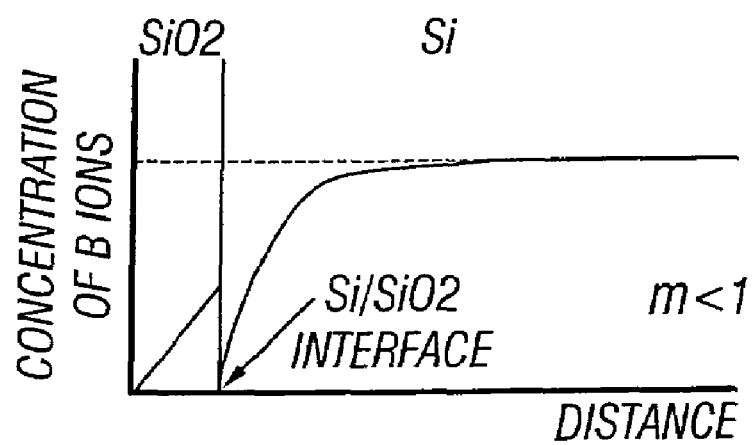
FIG. 7 is a diagram showing the distribution of a dopant at the Si/SiO$_2$ interface.

In the above case, the distribution of B-ion concentration at the Si/SiO$_2$ interface exhibits a tendency shown in FIG. 7. That is, the concentration of B ions at the Si/SiO$_2$ interface becomes lower than that shown in FIG. 5A. Furthermore, it is obvious that the concentration of B ions decreases in SiO$_2$.

Thus, by taking advantage of the fact described above, the concentration of B ions in the principal surface of the active layer can be effectively lowered, and a further precise control of the threshold voltage is enabled. Under an atmosphere containing hydrogen a further improved crystallinity is obtainable for the crystalline silicon film, because hydrogen ions compensate for the dangling bonds and defects in the crystalline silicon film constituting the active layer.

EXAMPLE 4

Figure 9:
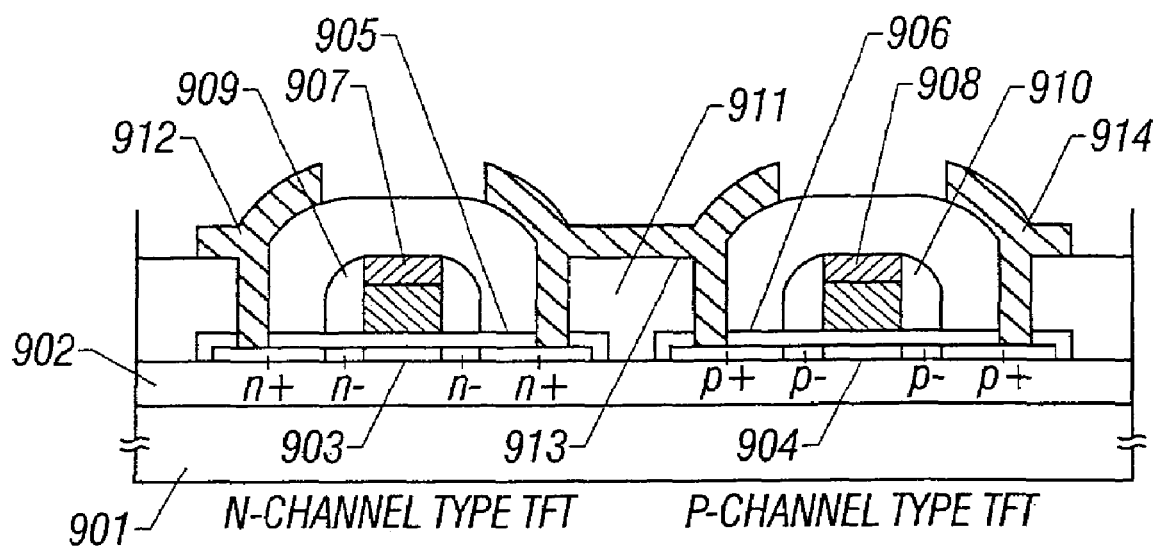
FIG. 9 is a cross sectional view showing the structure of a silicon gate TFT.

The present example refers to a case of using an electrically conductive crystalline silicon film for the gate electrode, and reference can be made to FIG. 9. The present example specifically refers to a case of manufacturing a CMOS circuit on a quartz substrate, but it may be formed on a glass substrate or a silicon substrate (inclusive of wafers). On the silicon substrate, an IC circuit using a conventional MOSFET can be manufactured, or a so-called SOI structure can be constructed.

Referring to FIG. 9, a silicon oxide film 902 which functions as a base film is formed on a quartz substrate 901. Active layers having LDD regions are denoted by 903 and 904, which become an n-channel TFT and a p-channel TFT, respectively. The active layers 903 and 904 are formed in the following manner.

A crystalline silicon film is formed first on the silicon oxide film 902. It may be formed by following the means described in Example 1, or by directly depositing the crystalline silicon film by means of reduced pressure thermal CVD using a silane gas such as $SiH_4$, $Si_2H_6$, or $SiH_2Cl_2$ for the gaseous starting material. In the present example, a non-doped crystalline silicon film is used. Once the crystalline silicon film is obtained, it is patterned into an island-like structure to obtain the protocol of the active layer to perform channel doping. The channel doping is performed in the same manner as in Example 1; i.e., B ions are added into the p-channel TFT alone.

Subsequently, by effecting a thermal oxidation step, gate insulating films 905 and 906 are formed and the concentration of B ions in the vicinity of the $Si/SiO_2$ interface is reduced. The heat treatment is performed under the optimum conditions by taking into consideration, for instance, the film quality of the thermal oxidation film, film thickness, the concentration of B ions for controlling the threshold value, etc. As a matter of course, it is also possible to form a gate insulating film by removing the thus formed thermal oxidation film, followed by film deposition of a silicon oxide film employing plasma CVD using, for example, gaseous $TEOS/O_2$ system or gaseous $SiH_4/N_2O$ system.

Gate electrodes 907 and 908 are formed thereafter, and impurity ions are implanted by using them as masks. This step of impurity implantation is necessary for the formation of source/drain regions, low concentration impurity region (LDD region), and a channel region inside the active layers 903 and 904.

Because the LDD region is provided for the purpose of improving resistance against degradation, this region may not be necessary for a p-channel TFT suffering less from degradation. In case of forming a CMOS circuit on a single substrate, this step of forming the LDD region is somewhat complicated because the impurity is implanted selectively. Thus, a simplified method is realized by omitting the LDD region. In the present example, an LDD region is formed on both of the n-channel and p-channel TFTs.

A first impurity implantation of P ions and B ions is performed. Upon completion of the implantation, a silicon nitride film is formed by film deposition, and side walls 909 and 910 are formed by using anisotropic etching. A second impurity implantation of P ions and B ions is carried out thereafter to form the source/drain regions of the n-channel TFT and the p-channel TFT. The regions just under the side walls 909 and 910 become the low concentration impurity regions (LDD regions). The regions just under the gate electrodes 907 and 908 provide the channel regions.

Upon completion of the active layers 903 and 904, a titanium (Ti) film or a cobalt (Co) film is formed over the entire surface by means of sputtering, so that it may be reacted with the silicon film exposed on the source/drain regions and gate electrodes 907 and 908. Reaction occurs by performing heat treatment, but it is preferred to use an RTA method from the viewpoint of easy control of the processing atmosphere, and high through-put. This technique is known as salicide technique.

Thus, a part of the source/drain region and the gate electrodes 907 and 908 is converted into salicide (more specifically, titanium silicide or cobalt silicide is obtained in the present example) to provide a region with low resistance. Thus, a CMOS circuit of a structure as shown in FIG. 9 is obtained by forming an interlayer insulating film 911 by film deposition, and forming interconnections 912 to 914 after perforating contact holes on the interlayer insulating film 911.

EXAMPLE 5

The present invention is applicable to various types of semiconductor integrated circuits. The present example shows an embodiment according to the present invention, for a case of applying the invention to a SRAM (static random access memory). The method is described below with reference to FIG. 10.

The SRAM is a memory using a bistable circuit such as a flip-flop as a memory element, and stores a binary information value (0 or 1) in accordance with the two stable states, i.e., ON-OFF or OFF-ON, of the bistable circuit. This type of memory is advantageous in that the memory is maintained so long as power supply is available. A memory circuit is constructed from NMOS circuits and CMOS circuits. Referring to FIG. 10A, the SRAM circuit is a circuit using high resistance for the passive load element.

Figure 10:
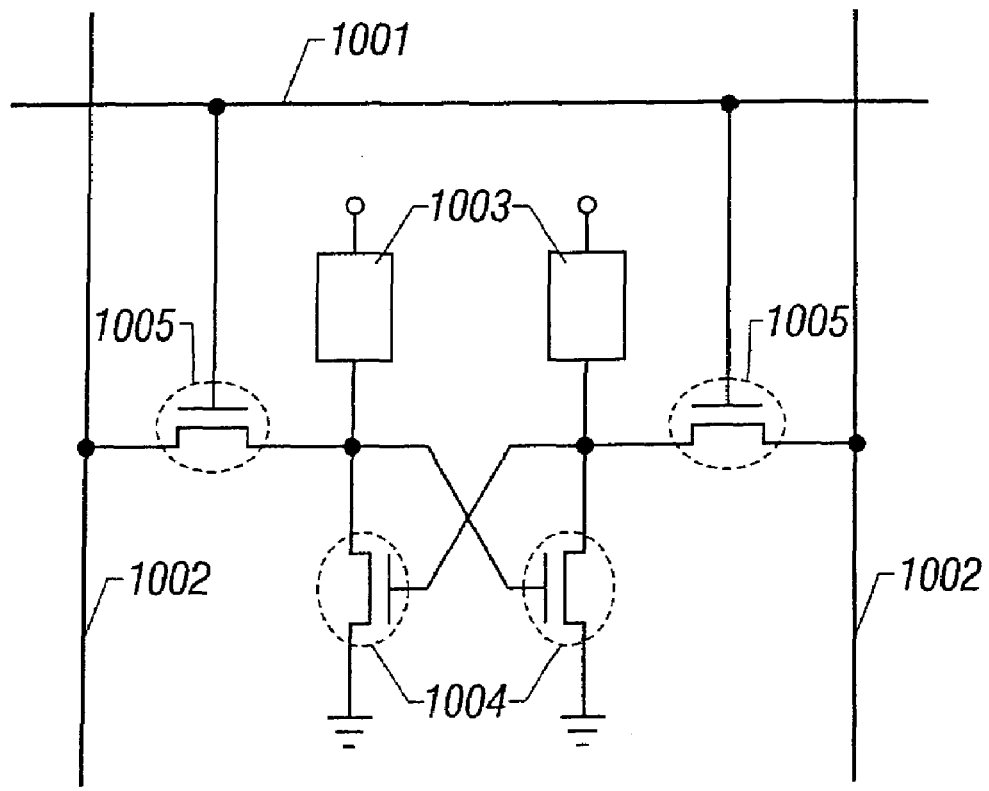
FIG. 10 is a diagram showing the circuit constitution of an SRAM.

Referring to FIG. 10, the SRAM comprises a word line 1001, a bit line 1002, a load element 1003 consisting of high resistances, two pairs of driver transistors 1004, and two pairs of access transistors 1005. An SRAM of such a constitution is characterized by the high speed operation and high reliability, and it can be readily embedded into a system.

EXAMPLE 6

The present example relates to a case of employing, in addition to the present invention, the technique disclosed in Japanese Laid-open Patent Application No. 7-176753. For instance, B ions are added not only into the p-channel TFT, but also into the n-channel TFT.

More specifically, in performing channel doping on a p-channel TFT, B ions, which impart the reverse conductive type, are added into a part of the active layer of an n-channel TFT. This technique comprises preventing a leak current from generating (short channel leak) by forming a high current region having a high energy barrier to a portion apt to form a current pass, for instance, the edge portion of an active layer. Japanese Laid-open Patent Application No. 7-176753 discloses achieving various effects by using a variety of impurities, and the present invention uses a part of the constitution (utilizing an impurity which imparts a conductivity reverse to that of the active layer).

In the embodiment according to Example 1 with reference to FIGS. 2A to 2E, channel doping of the active layer 205 of the p-channel TFT is performed selectively by providing a resist mask 206 to the n-channel TFT. In the present example, however, an aperture is formed previously at a part of the resist mask 206, and B ions are added selectively to a part of the active layer 204 of the n-channel TFT.

It is therefore possible to set an arbitrary region in the active layer 204 of the n-channel TFT to add therein B ions. Some application examples are described below.

In the planar view of a CMOS circuit in FIG. 11A are shown an active layer 1101 for the n-channel TFT, another active layer 1102 for the p-channel TFT, a gate electrode 1103 made of a crystalline silicon film, and an interconnection (a source or a drain) 1104 made of an electrically conductive material.

The hatched region in the active layers 1101 and 1102 are the regions into which B ions were added at the channel doping. In the present example, the region with no addition of B ions is the substantially intrinsic I layer, and the region into which B ions are added in the channel doping step is treated as a P-- layer. It should be noted, however, that the purpose of channel doping is to add B ions to impart a p-type conductivity to the active layer that, as a whole, is acting as an N-- layer to thereby bring the feature of that layer close to that of an I layer. Thus, in the present example, the I layer is substantially a weak N layer (N-- layer), and the P-- layer is substantially an intrinsic I layer.

Referring to FIG. 11A, B ions are added only into the edge portion of the active layer 1101 of the n-channel TFT to convert this portion into a P-- layer imparted with a reverse conductivity. The edge portion is apt to form a current path because it is likely to be impaired by plasma damage and the like. Thus, a high energy barrier is formed by providing a P-- layer at this portion to thereby prevent leak current from generating.

FIG. 11B shows the cross sectional view of the n-channel TFT of the CMOS circuit taken along line A-A'. It can be seen clearly therefrom that a P-- layer is formed at the edge portions 1105 and 1106 of the active layer, and that the portion right under the gate electrode (the region 1106) remains as an I layer. On the other hand, FIG. 11C shows the cross sectional view of a p-channel TFT taken along line B-B'. From FIG. 11C, it is clear that B ions are added into the region under the gate electrode (the region 1107), thereby forming a hatched region corresponding to the P-- layer.

FIG. 11D shows the cross section of the CMOS circuit taken along the transverse direction C-C'. In this case again, the constitution of the active layer for the n-channel TFT differs from that for the p-channel TFT. In the n-channel TFT, the source region 1108 and the drain region 1109 become strongly n-type (i.e., to yield N++ layers) by the heavily added P ions, whereas the channel region 1110 remain as an I layer.

In case of p-channel TFT, B ions are added into the source region 1111 and the drain region 1112 at a high concentration to yield strongly p-type conductive layers (i.e., P++ layers), whereas the channel region 1113 becomes a P-- layer into which trace quantity of B ions is added.

FIGS. 11E, 11F, 11G, and 11H are other examples of adding B ions into the active layer of the n-channel TFT. FIGS. 11E and 11F show cases in which a P-- layer is locally provided to the edge portion, and FIG. 11G shows a case in which the reduction of leak current in source/drain is aimed. FIG. 11H illustrates a case in which the edge portion is surrounded by a P-- layer so as not to further impair the edge portion of the active layer that was damaged in the channel doping step.

As described above, it is possible to add B ions into the n-channel TFT at the same time with performing channel doping, and effectively utilizing the technique for suppressing leak current in parallel with the method according to the present invention. The addition of ions into the n-channel TFT can be performed by simply providing an aperture only to the desired region of the resist mask. Thus, this technique is not only effective for the present case, but is widely applicable.

If a constitution as such of not adding ions to the edge portion alone should be employed in adding B ions into the p-channel TFT at the same time with channel doping, the portion with no addition of ions remains as a region imparted with reverse conductivity, and effectively suppresses the leak current. An example of such a case is explained below with reference to FIGS. 12A to 12F. The symbols used in FIGS. 11A to 11H are used below because the structure of the CMOS circuit is the same.

Referring to FIG. 12A, a P-- layer is formed at the edge portion of the N-channel TFT 1101 by the B ions added therein. The explanation herein refers only to a case of adding B ions into the region shown in FIG. 12A, because the details are already described above. The only difference from FIG. 11A is the constitution of the active layer 1201 of the p-channel TFT.

The cross sectional view (FIG. 12B) of the n-channel TFT taken along line A-A' in FIG. 12A is not particularly different from the case described above, but in the cross section (FIG. 12C) taken along line B-B' of the p-channel TFT shows an I layer for the edge portion 1202. As a matter of course, the region 1203 other than the edge portion is converted into a P-- layer because it is subjected to channel doping.

As described in the foregoing, the I layer is substantially an N-- layer, and the P-- layer is substantially an I layer. Thus, the I layer (which is substantially an N-- layer) into which B ions are not added acts, with respect to the p-channel TFT, as a region of reverse conductivity. More specifically, the transfer of carriers is prevented from occurring because the energy barrier between the thus formed P-type and the N-type regions is high.

Referring to FIG. 12D, the source region 1204 and the drain region 1205 of the p-channel TFT become P++ layers which exhibit a strong p-type conductivity, whereas the channel region 1206 changes into a P-- layer. Referring to FIG. 12C, more specifically, the effect of reduced leak current can be realized by finally implementing a constitution comprising an I layer, to which is substantially imparted a reverse conductive type (n type), being formed on at least the edge portion of the channel region. An example having such a constitution can be obtained by reserving I layer in the region shown in FIGS. 12E and 12F.

EXAMPLE 7

The CMOS circuit manufactured in Example 1 can be applied to an active type display device. As an active display device, generally known is an active matrix liquid crystal device. The constitution thereof is shown in FIG. 13.

Figure 13:
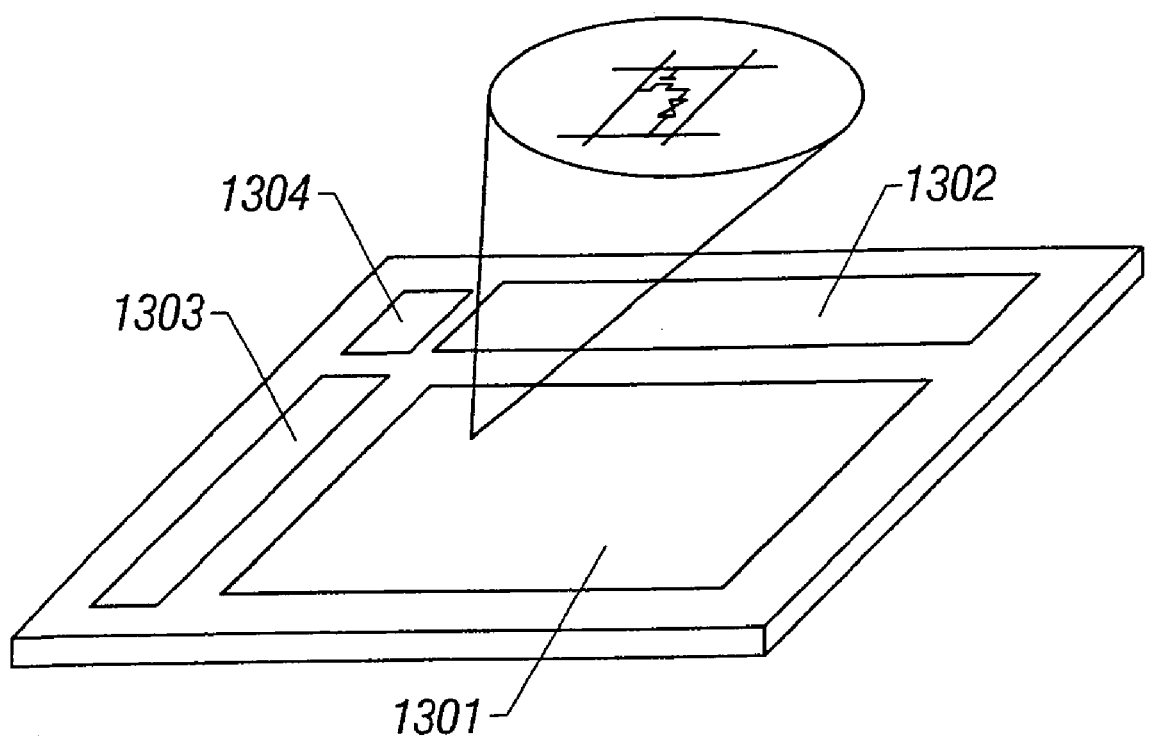
FIG. 13 shows a constitution of an active matrix type display device.

The constitution shown in FIG. 13 is a SOG (system on glass) type display device having pixel regions and peripheral drive circuits formed on a single substrate, also equipped with control circuits such as a memory circuit and a CPU circuit.

Referring to FIG. 13, a pixel region 1301 generally comprises million and several hundreds of TFTs being arranged in a matrix, and controls the voltage applied to the liquid crystal. The constitution is also equipped with a vertical scanning drive circuit 1302, and a horizontal scanning drive circuit 1303. These drive circuits comprise a shift resister circuit, a buffer circuit, a sampling circuit, etc. to control the gate signals and video signals. The control circuit 1304 is constructed by a CPU circuit, a memory circuit, etc.

In the constitution with reference to FIG. 13, a semiconductor device having a CMOS structure is used for the horizontal and vertical scanning drive circuits 1302 and 1303, a control circuit 1304, etc. Furthermore, because the semiconductor device having a CMOS structure as manufactured in accordance with Example 1 can be driven at low drive voltage, a design with considerable allowance in withstand voltage is possible. Thus, the device is suitable for the drive circuits and the like described above, to which high reliability is required.

The present invention is applicable not only to an active matrix liquid crystal device with reference to FIG. 13, but also to other electro optical devices inclusive of other types of active flat panel displays, for instance, an EL display device and a CL display device. Furthermore, it is applicable not only to direct view type displays, but also to projection type display devices.

In an active type display device, high speed operation is required to the peripheral drive circuit partly from the viewpoint of suppressing flickering and the like by speeding up the response of the display image plane. High speed operation is particularly required to the shift resister circuits and counter circuits which perform the clock operation.

Figure 14A:
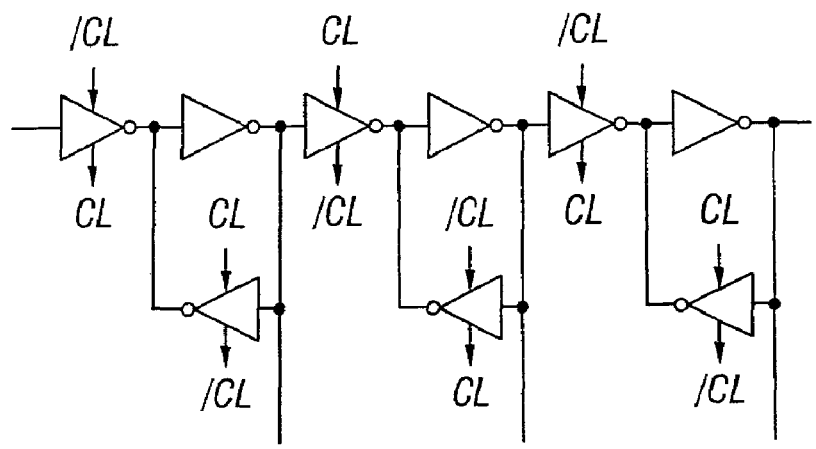
FIGS. 14A to 14C are diagrams showing the constitution of a shift resister circuit.

FIG. 14A shows a shift resistor circuit constituting a gate driver portion. The function of the shift resistor circuit is to select the gate lines arrayed in the pixel region sequentially (or one by one). Thus, if the operation speed of the shift resistor circuit should be low, the selection of a gate line consumes time as to finally elongate the time necessary for the completion of a single field (or a single frame) in the display image plane. Thus, flickering occurs on the image plane.

Figure 14B:
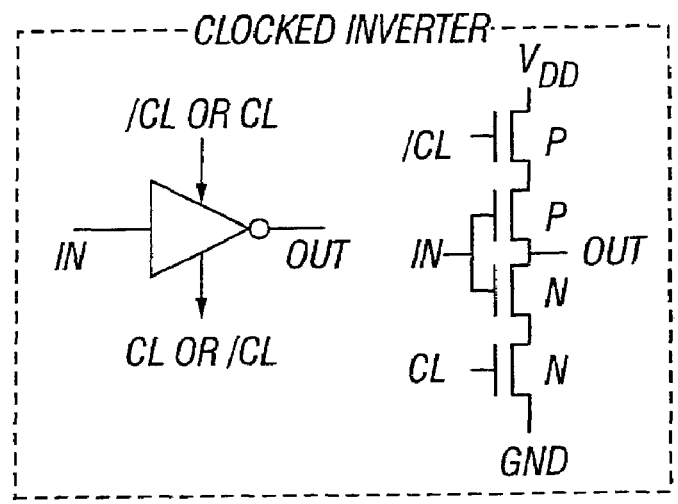
Figure 14C:
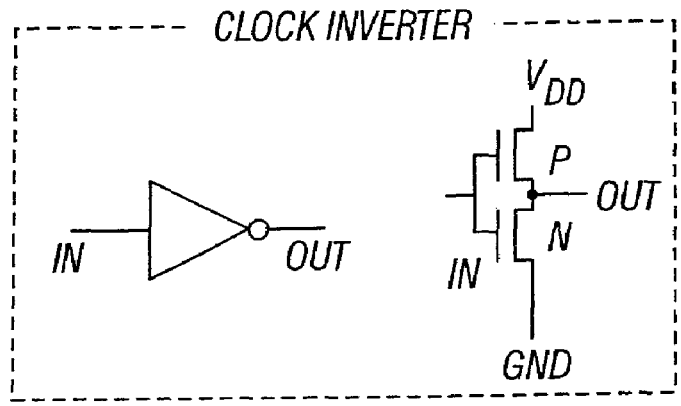

The shift resistor circuit described above is constructed basically by a clocked inverter circuit shown in FIG. 14B and an inverter circuit with reference to FIG. 14C. Since both circuits with reference to FIGS. 14B and 14C are constructed by CMOS circuits, the present invention is applicable to the CMOS circuits.

As described above in Example 1, the CMOS circuit manufactured in accordance with the present invention consists of n-channel TFT and p-channel TFT which yield a threshold voltage at approximately the same absolute value, and a window that is substantially symmetrical with respect to Vg=0V. Thus, it can be seen that the CMOS circuit according to the present invention yields a well-balanced characteristics free from deviation in the output voltage. Furthermore, because the width of the window is narrow (i.e., the absolute values for Vth,n and Vth,p are both small), the power necessary for driving the circuit is advantageously low.

As described above, it is very effective to manufacture a CMOS circuit having a well-balanced characteristics by applying the present invention, and to use it as a peripheral drive circuit of other semiconductor devices. In general, a drive circuit operating at a high speed tends to suffer low withstand voltage and extreme degradation. However, because the power consumption, i.e., the drive voltage, of the TFT manufactured in accordance with Example 1 can be suppressed low, a drive circuit with less fear of degradation but with high reliability can be implemented.

EXAMPLE 8

The present example relates to a semiconductor device having a CMOS structure comprising combined therein an n-channel semiconductor device and a p-channel semiconductor device in a complementary manner, said each of the semiconductor devices comprising at least an active layer made of crystalline silicon film provided on a substrate having an insulating surface; a gate insulating film obtained by applying thermal oxidation treatment to the active layer; and a gate electrode provided on said gate insulating film; wherein, an impurity element for imparting a p-type conductivity is added into the active layer of the p-channel type semiconductor device alone; the concentration distribution of the impurity element is discontinuous at the interface between the active layer and the gate insulating film, and, on the active layer side in the vicinity of the interface, it tends to decrease with approaching the interface; and the impurity element remaining in the vicinity of the interface on the active layer side is used for the control of threshold voltage.

Another example of manufacturing a CMOS circuit comprising a n-channel TFT and a p-channel TFT combined in a complementary manner in accordance with the present invention is described below. The CMOS circuit to manufacture in the present example is an inverter circuit of the simplest constitution as shown in FIG. 1A. The threshold voltage is controlled by adding B ions into the p-channel TFT alone. Thus, the present example is described with reference to FIGS. 15A to 15C.

Figure 15A:
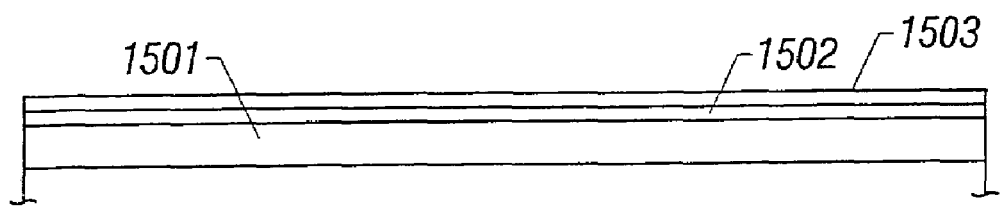
FIGS. 15A to 15C are diagrams showing other steps of manufacturing a thin film transistor.
Figure 15B:
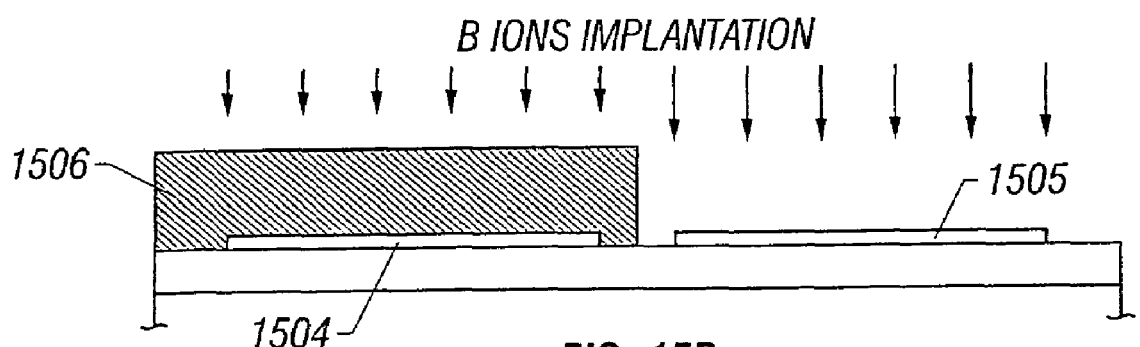

Referring to FIG. 15A, a silicon oxide film is formed by deposition as a base film 1502 on the surface of a quartz substrate 1501. The substrate 1501 can be selected from glass substrates, quartz substrates, silicon substrates (wafers), etc. However, in case the temperature of the later thermal oxidation step is high, i.e., more specifically, in case the temperature exceeds 650° C., it is preferred to utilize a quartz substrate having an excellent heat resistance, and not to use a glass substrate having a low softening point.

A crystalline silicon film is formed thereafter to provide an active layer of the TFT. In the present example, an amorphous silicon film is crystallized to obtain the crystalline silicon film. Thus, an amorphous silicon film is first deposited to a thickness of 1,000 Å by using reduced pressure thermal CVD or plasma CVD. Because the film thickness decreases in the later step of thermal oxidation, the film described above is formed thicker than the desired film thickness.

Once an amorphous silicon film is formed, the resulting film is crystallized by means of heat treatment, laser annealing, or the both. In the present example, the crystallization is performed by using the technique described in Japanese Laid-open Patent Application No. 6-232059 and Japanese Laid-open Patent Application No. 7-321339 proposed by the present inventors. The technique described above enables a silicon film having excellent crystallinity by first applying a metallic element, such as nickel or copper, to the amorphous silicon film, and while maintaining this state, subjecting it to a heat treatment at a temperature in a range of from 500 to 700° C., representatively from 600 to 650° C., for a duration of from 1 to 24 hours, representatively for 4 to 12 hours.

The amorphous silicon film (not shown) is crystallized by performing the means described above to obtain a crystalline silicon film 1503. The crystalline silicon film 1503 thus obtained exhibits a superior crystallinity as compared with crystalline silicon films obtained without using the above means. Furthermore, according to the present inventors knowledge, a further superior crystallinity is realized by applying laser annealing to the silicon film thus crystallized by heat treatment. Thus is obtained a state as shown in FIG. 15A.

Then, the crystalline silicon film 1503 is patterned to obtain an island-like semiconductor layer 1504 which later constitutes the active layer of an N-channel TFT and another island-like semiconductor layer 1505 which later constitutes the active layer of a p-channel TFT.

Then, after a resist mask (not shown) for use in the patterning of the island-like semiconductor layers 1504 and 1505 is removed by using a specified solution for peeling, another resist mask 1506 covering the island-like semiconductor layer 1504 which becomes the active layer of the n-channel TFT is formed again. Then, B ions, which are impurity elements for imparting p-type conductivity are added to the island-like layer 1505 alone (channel doping step).

In the present example, B ions that are obtained by mass separation are implanted by ion implantation at a concentration of from $1\times10^{16}$ to $1\times10^{19}$/cm$^3$. In this method, B ions are added in the atomic form that, the ions can be uniformly distributed in the island-like semiconductor layer. In case ion implantation is effected without using mass separation, a diffusion step must be incorporated to realize a uniformly distributed state because B ions are added as clusters together with other atoms and molecules.

The optimum quantity of B ions to be added (addition concentration) must be determined experimentally because it differs depending on how threshold voltage (Vth) changes. In the constitution according to the present invention, the concentration of B ions at the Si/SiO$_2$ interface in the channel forming region is determined after the step of thermal oxidation which appears later. The addition concentration must be controlled by taking this fact into consideration.

The present example refers to a case of adding B ions by means of ion implantation. Otherwise, a gas containing B ions (e.g., diborane) may be used as the gaseous starting material to add B ions during the film deposition of amorphous silicon. However, care must be taken in such a case because the threshold voltage of the n-channel TFT also shifts to the positive side.

Figure 15C:
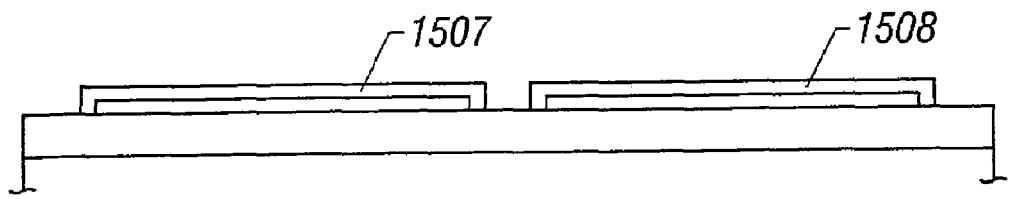

After the step of adding B ions is completed, thermal oxidation process is effected after removing the resist mask 1506. As a means of thermal oxidation, heat treatment is performed at a temperature of from 800 to 1,100° C., more specifically at 950° C., under an oxidizing atmosphere containing from 1 to 10%, preferably 3%, of hydrogen chloride (HCl) with respect to oxygen (O$_2$) (FIG. 15C).

Three objects enumerated below is to be achieved by the thermal oxidation step in the present example: firstly, by gettering, removing the catalytic element (nickel in the present example) used in the crystallization; secondly, reducing (or controlling) the B ion concentration at the Si/SiO$_2$ interface by taking up B ions into the thermal oxidation film; and forming gate insulating films 1507 and 1508. Particularly essential among the objects described above is the second one; i.e., reducing the concentration of B ions in the Si/SiO$_2$ interface.

It can be seen clearly from FIG. 4 that boron is less diffusible than nickel. For instance, at 950° C., i.e., at the temperature of effecting the thermal oxidation treatment described above, the diffusion coefficient for nickel is about $4 \times 10^{-8}$ cm$^2$/s, and is about 10,000 times the diffusion coefficient for boron (about $4 \times 10^{-14}$ cm$^2$/s).

Accordingly, nickel in the island-like semiconductor layers 1504 and 1505 rapidly moves to combine with Cl ions to form a nickel chloride. The nickel chloride is highly volatile, and it readily desorbs into gaseous phase. Thus, nickel in the film is removed by gettering.

Similar to the case of Example 1, the resulting concentration of B ions and P ions in the vicinity of Si/SiO$_2$ interface after the thermal oxidation process is shown in FIG. 5.

In the present example, the 500 Å thick thermal oxide film thus obtained through the thermal oxidation process described above is used as a gate insulating film. In case the thermal oxidation film is used as the gate insulating film, a TFT having extremely superior electric characteristics can be implemented because the interface state and the like in the vicinity of the Si/SiO$_2$ interface is reduced. Furthermore, the film thickness of the thermal oxide film can be controlled by changing the temperature, duration, and atmospheric conditions of the thermal oxidation process.

In the case of the present example, moreover, the thermal oxidation process is performed at 950° C., i.e., at a relatively high temperature. Accordingly, the crystallinity of the island-like semiconductor layers 1504 and 1505 is greatly improved. More specifically, the Si dangling bonds that are left upon desorption of nickel during the gettering of nickel ions by Cl ions recombine with the neighboring Si as to form Si—Si bonds. Thus, as a result, intragranular defects or defects that are present in the grain boundaries are greatly reduced to increase the crystallinity.

Figure 2D:
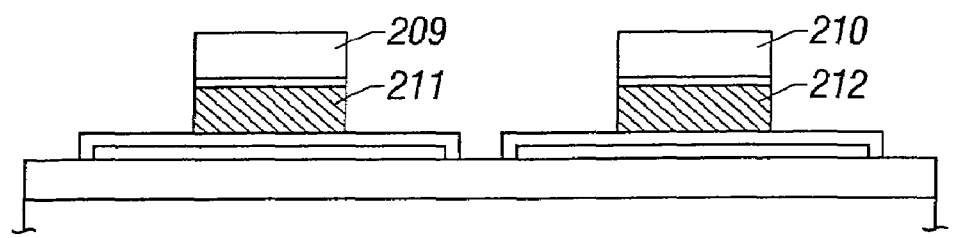
Figure 2E:
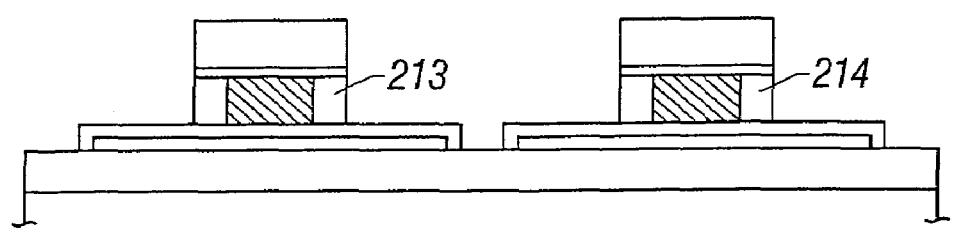

Once a state as shown in FIG. 15C is obtained after the thermal oxidation step, a semiconductor device as shown in FIG. 3D is formed in the same manner as described in Example 1 with reference to the steps of FIG. 2D and after that.

[Explanation of the TFT in Example 8]

Figure 16:
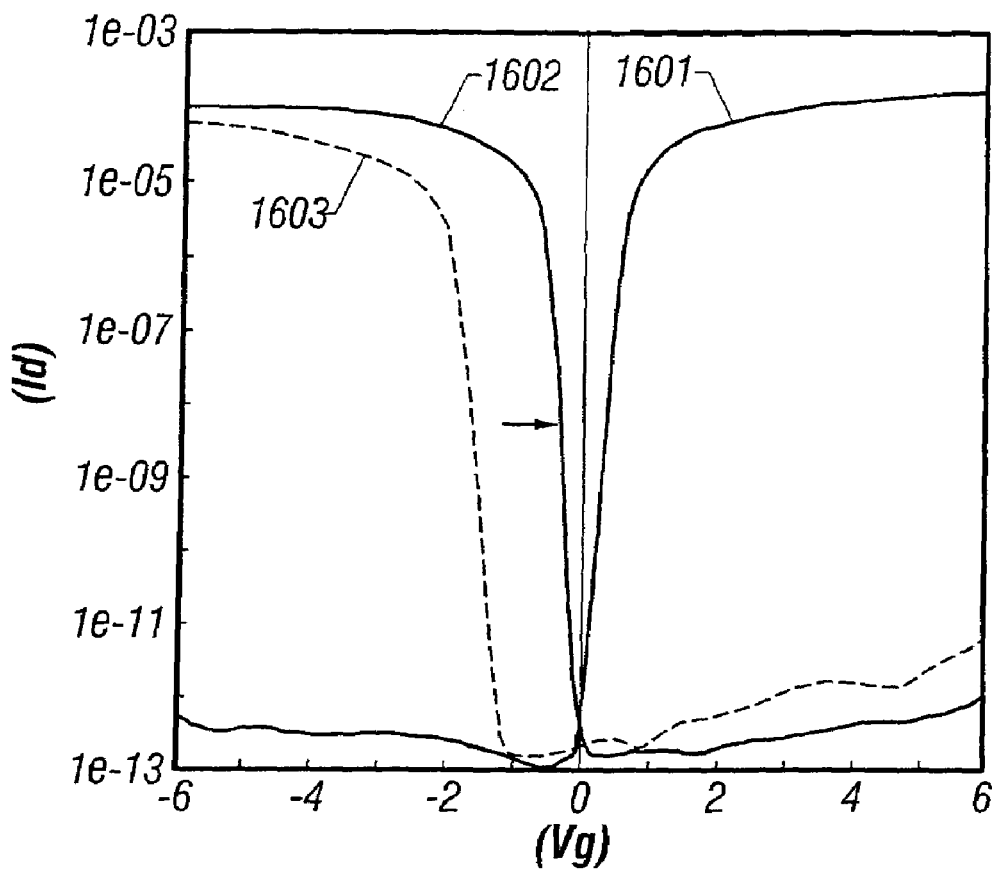
FIG. 16 is other graph showing the characteristics of a thin film transistor.

The electric characteristics (Id-Vg characteristics) of the TFT manufactured in accordance with Example 8 and which is shown in FIG. 3D is given in FIG. 16. Referring to FIG. 16, the curve (solid line) indicated by 1601 is the Id-Vg characteristics of the N-channel TFT, and the curve (solid line) indicated by 1602 is the Id-Vg characteristics of the p-channel TFT. The curve (broken lines) 1603 is the Id-Vg characteristics for a p-channel TFT using a constitution other than that of the present invention. In the graph, the abscissa shows the gate voltage (Vg) of the TFT, and the ordinate gives the drain current (Id). The Id-Vg characteristics was obtained for a case drain voltage Vd is set to 1 V.

In the present example, the threshold voltage Vth,n obtained through the calculation from the Id-Vg characteristics 1601 of the n-channel TFT is in a range of from 0.1 to 0.5 V, and at least fitting in a range of from −0.2 to 0.5 V. The threshold voltage Vth,p obtained through the calculation from the Id-Vg characteristics 1602 of the p-channel TFT is in a range of from −0.05 to −0.1 V, and at least fitting in a range of from −0.5 to 0.2 V.

When compared with the Id-Vg characteristics 1603 of a conventional p-channel TFT, the Id-Vg characteristics 1602 for the TFT using the present invention is evidently shifted to the positive direction (the direction shown by an arrow). The threshold voltage obtained through the calculation from the Id-Vg characteristics 1603 shown by broken lines is in a range of from −1.5 to −1.0 V. Thus, it can be seen that this shift is as subtle as for a several tenth of volts, and that an extremely precise control which was never controllable by a conventional channel doping technique is realized.

The above fact clearly shows that channel doping is performed extremely precisely by using the present invention. Furthermore, as shown in the present example, this invention is particularly effective for a TFT having a sufficiently low threshold voltage without especially applying channel doping.

The most striking future of the semiconductor manufactured in accordance with the present example is that the semiconductor excels in high speed operation. Thus, the semiconductor obtained in the present example is particularly suitable for use where high speed operation is required, e.g., as a peripheral drive circuit by constituting a CMOS circuit, and particularly, as a shift resister circuit.

Figure 18:
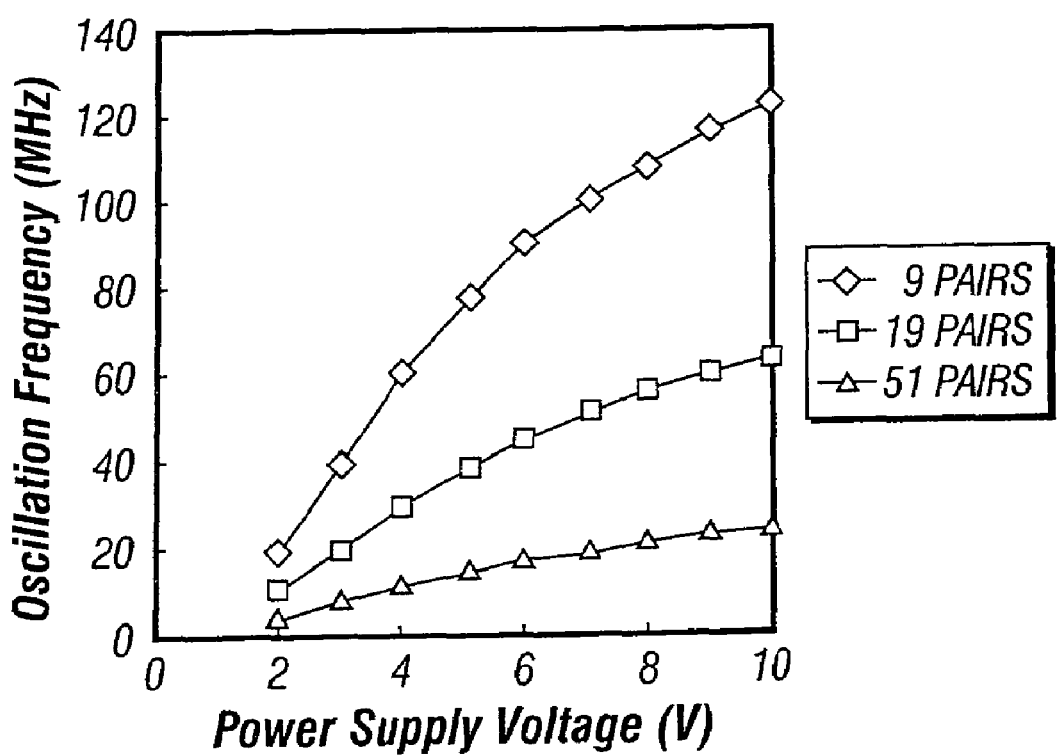
FIG. 18 is a graph showing the frequency characteristics of a CMOS circuit.

The present inventors further manufactured a ring oscillator by serial connecting odd pairs of the CMOS circuit shown in FIG. 3D. As a result, excellent frequency characteristics as shown in FIG. 18 is obtained. The measurement was performed on a ring oscillator comprising 9, 19, or 51 pairs of CMOS circuits to obtain the relation between the power supply voltage and the oscillation frequency.

Referring to FIG. 18, in case of a ring oscillator containing 9 pairs operated at a power supply voltage of 10 V, an oscillation frequency of 123 MHZ is obtained. This fact shows that an extremely high operation speed is obtained. As described above, such a result is greatly attributed to the extremely low S value. Accordingly, in case of constituting a circuit capable of high speed operation as shown in FIG. 18, the S value should be 85 mV/dec or lower, and preferably, 75 mV/dec or lower.

The present example refers to a case in which the thin film transistor is manufactured by using a crystalline silicon film being formed on a quartz substrate, this constitution also contributes in realizing high frequency characteristics. The explanation for this is given below.

In a MOSFET formed on a silicon wafer, in general, the operation frequency f is known to be inversely proportional to the time constant τ, i.e., f=1/τ. Since τ can be expressed by the product of capacitance C and resistance R, f=1/CR is another expression for f. The capacitance C includes gate capacitance, depletion layer capacitance, interconnection capacitance, interconnection-substrate capacitance, etc., whereas the resistance R includes source/drain resistance, interconnection resistance, etc. Accordingly, the operation frequency depends on all of these capacitances and resistances.

To increase the operation frequency, active study has been performed on how to reduce the interconnection resistance. However, as the interconnection became finer, this was found to be extremely difficult. Thus, the technique of reducing interconnection-substrate capacitance has attracted much attention. This was made possible by SOI technology, but still, the achievement at best is the reduction of capacitance.

The thin film transistor technology that has greatly advanced recently is characterized in that the transistor is directly formed on a glass substrate or a quartz substrate. This is greatly advantageous in that there is no interconnection-substrate capacitance. Considering that the performance (i.e., the electric characteristics) of the TFT manufactured in accordance with the present example is well comparable to the TFT of SOI structure, it is expected that the TFT according to the present invention excels the TFT of SOI structure in frequency characteristics.

Furthermore, the operation frequency f is known to be inversely proportional to the square of the channel length L. In ICs, for instance, a channel length of 0.35 µm was necessary to achieve a high speed operation of 200 MHz. However, a TFT of SOI structure can achieve an operation frequency of 200 MHz even if the channel length exceeds the limit described above. Since the TFT according to the present example is superior to the TFT of SOI structure by the interconnection-substrate capacitance, a further margin can be provided by the channel length L, and, in some cases, a yet higher operation over 200 MHz may be possible.

In the constitution according to the present example, as described in the foregoing, the threshold voltage of the p-channel TFT alone is controlled by channel doping. Thus, a narrow window width and a balanced Id-Vg characteristics can be achieved. In particular, the most distinguished future in the present invention is that the redistribution of the added ions is effected after the channel doping step to thereby lower the concentration of the added ions in the vicinity of the $Si/SiO_2$ interface of the channel region.

Thus the precise control of the threshold voltage can be realized. Accordingly, in the case the threshold voltage is small and the extremely precise channel doping is required as is described in the present invention, this can be utilized as a very effective means.

[Explanation of Eg of Active Layer]

The present inventors further measured at room temperature (10 to 30° C.), the energy band gap (Eg) of the crystalline silicon film manufactured according to the present example. More specifically, the value of Eg is obtained as follows. The optical absorption spectrum of the crystalline silicon film is measured to obtain the effective transmittance of the silicon film as a function of the optical wavelength, and the optical wavelength at the absorption edge at which the effective transmittance begins to drop is converted into energy in accordance with the equation $E=hc/\lambda$, wherein E is the energy, h is the Plank constant, c is the velocity of light, and $\lambda$ is the wavelength.

Figure 19:
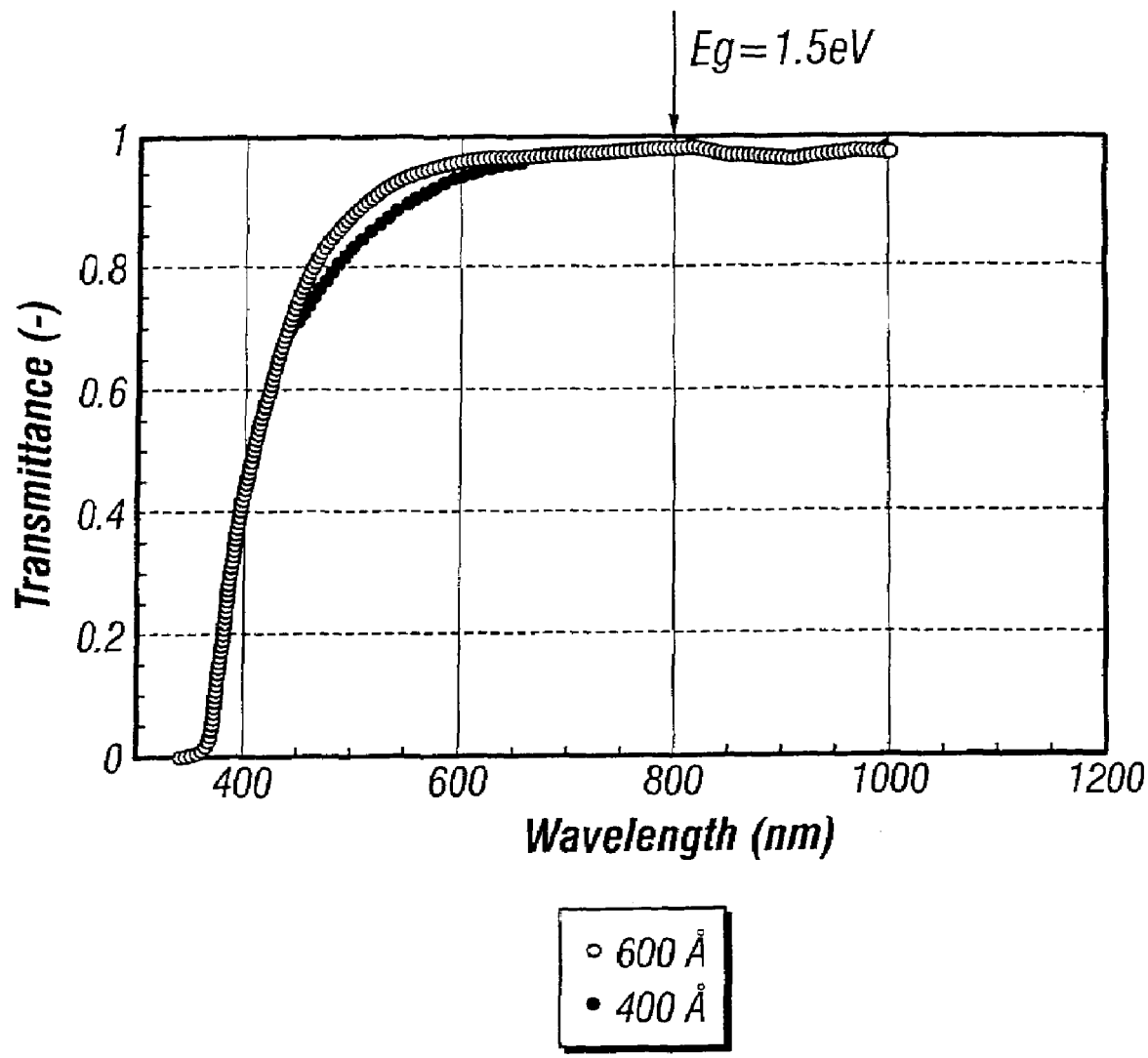
FIG. 19 is a graph showing the change of transmitted light with changing wavelength.

The experimental data obtained by measuring the optical absorption spectrum for the crystalline silicon film according to the present example is given in FIG. 19. In FIG. 19, the abscissa is the optical wavelength in a normal visible region, and the ordinate shows the effective transmittance (the transmittance calculated by omitting the reflected light component at the film plane) which is the ratio of light intensity before and after passing through the film. The measurement was performed on two films differing in film thickness, i.e., 400 Å and 600 Å.

When light is transmitted through the silicon film, the wavelength components having an energy higher than the Eg of the silicon film cannot pass through the film and is absorbed by the film, whereas those corresponding to a wavelength region having smaller energy than Eg pass through the film. Thus, the energy of light having the wavelength corresponding to the absorption edge of the optical absorption spectrum is assumed to be equal to Eg.

Referring to FIG. 19, the transmittance begins to drop in a wavelength region of about 800 nm or shorter. From this value of 800 nm, Eg is calculated as approximately 1.5 eV. As described above, Eg is obtained from the Einstein photoelectric law: $Eg=hc/\lambda$, wherein h is the Plank constant, c is the velocity of light, and $\lambda$ is the wavelength.

The value of Eg thus obtained is closely related to the electric characteristics of the TFT. For instance, since the TFT manufactured in the present example is of an enhancement type, it should exhibit "normally OFF" characteristics (i.e., a characteristics that turns the TFT OFF when not selected). The key to realize this is that an Eg of 1.3 eV or higher is achieved. The reason for this is explained below with reference to FIG. 17.

Figure 17:
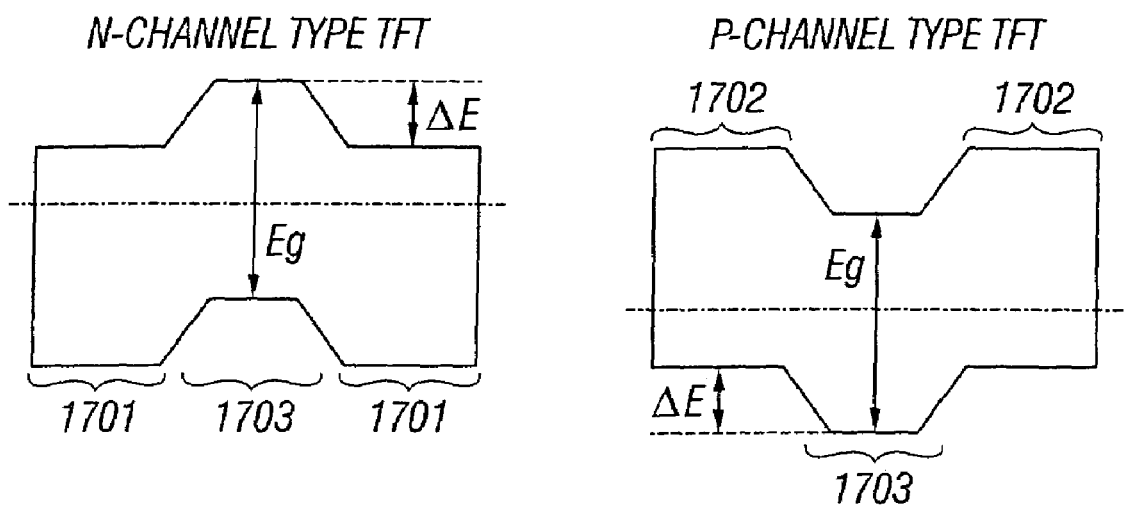
FIG. 17 is an explanatory diagram showing band structure for obtaining Eg.

FIG. 17 shows the schematically shown band state for the electrically conductive regions 1701 and 1702, which correspond to the source/drain regions, and the channel region 1703. The ΔE for the channel region of the p-channel TFT is slightly smaller than that of the n-channel TFT because trace quantity of B ions is added into the former region, but this subtle difference is neglected in the following discussion.

Referring to FIG. 17, an energy band gap (ΔE) is formed between the electrically conductive region 1701 (or 1702) and the channel region 1703. If the ΔE is not sufficiently large, the TFT exhibits an ON state (normally ON) even when not selected, and it becomes a so-called depression-type TFT.

In an SOI structure, for example, Eg equals to about 1.1 eV, and ΔE is as small as about 0.5 eV. Thus, the TFT exhibited "normally ON". Accordingly, the only way of achieving "normally OFF" was to intentionally increase ΔE by applying channel doping.

However, as shown in FIG. 17, ΔE obviously increases with the increase of Eg. According to the knowledge of the present inventors, if an Eg of 1.3 eV or higher should be achieved, ΔE becomes large enough to realize a "normally OFF" state. Thus, in implementing an enhancement-type TFT according to the present example, it is important to achieve an Eg of 1.3 eV.

In case Eg is equal to 1.3 eV, the optical wavelength obtained in accordance with the equation of photoelectric described above is about 950 nm. Thus, a high performance TFT as shown in the present example is available in a region of 800±150 nm in wavelength, i.e., a region of Eg of from 1.3 to 1.9 eV, preferably from 1.4 to 1.7 eV.

EXAMPLE 9

In Example 8, gettering of the catalytic element (Ni) was performed by using gaseous HCl. However, the same can be effected by using fluorine gases such as of $NF_3$, $ClF_3$, etc. In such a case, the dangling bonds are terminated by fluorine at the gettering treatment, and this is more preferred because an Si—F bond is stronger than Si—H bond.

Furthermore, because gaseous $NF_3$ undergoes decomposition at 600 to 800° C., that is, at a temperature lower than that for the decomposition of gaseous HCl used in Example 1, the temperature of the heating treatment can be lowered. In the present example, the heat treatment is effected at 700° C. for a duration of from 30 to 60 minutes under an oxygen-based mixed gas atmosphere containing from 0.1 to 10% by weight, representatively 3% by weight of gaseous HCl, and from 0.1 to 3% by weight, representatively 0.3% by weight of gaseous $NF_3$.

As described above, the density of defects can be further lowered because the dangling bonds of silicon are recombined with each other, and those still remaining as dangling bonds are terminated by fluorine. Furthermore, because the temperature of the heat treatment is lowered by 200 to 300° C., the through put in the production method can be also improved.

The same effect described above can be obtained by performing wet oxidation treatment under an oxygen-based mixed gas atmosphere containing 3% by weight of hydrogen and 0.3% by weight of gaseous $ClF_3$ at a temperature range of from 500 to 600° C. for a duration of from 30 to 60 minutes. This case is further advantageous in that the gettering of nickel is effected by both chlorine and fluorine elements.

EXAMPLE 10

The invention disclosed in the present specification is applicable to electro optical devices using a semiconductor device, representatively, a TFT (thin film transistor). Electro optical devices include a liquid crystal display device, an EL (electroluminescent) display device, and an EC (electrochromic) display device.

Application examples of the commercially available products include TV cameras, personal computers, car navigation systems, TV projection systems, video cameras, etc. Those products are briefly described below with reference to FIG. 20.

Figure 20A:
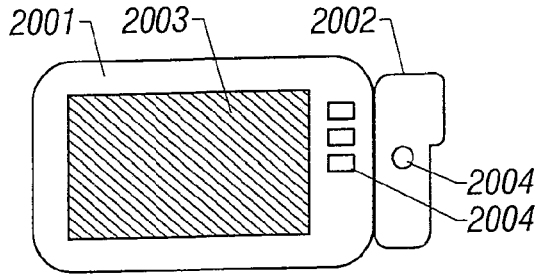
FIGS. 20A to 20E show application fields of the semiconductor device.

FIG. 20A shows a TV camera comprising a main body 2001, a camera 2002, a display device 2003, and operation switches 2004. The display device 2003 is also used as a view finder.

Figure 20B:
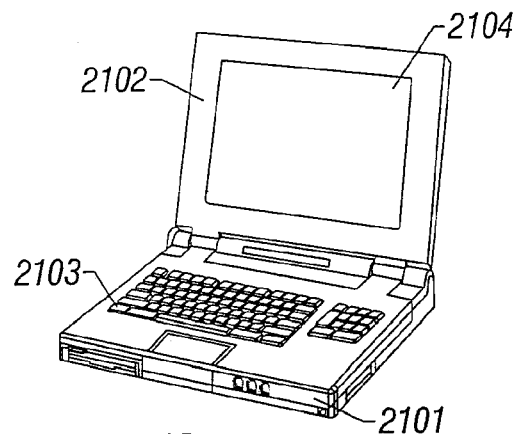

FIG. 20B shows a personal computer comprising a main body 2101, a cover portion 2102, a keyboard 2103, and a display device 2104. The display device 2104 is used as a monitor, and a diagonal of ten and several inches in size is required.

Figure 20C:
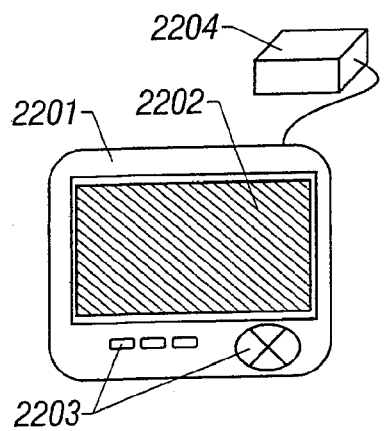

Referring to FIG. 20C, a car navigation system comprises a main body 2201, a display device 2202, operation switches 2203, and an antenna 2204. The display device 2202 is used as a monitor, but the main usage thereof is to display a map. Thus, the allowance in resolution is relatively large.

Figure 20D:
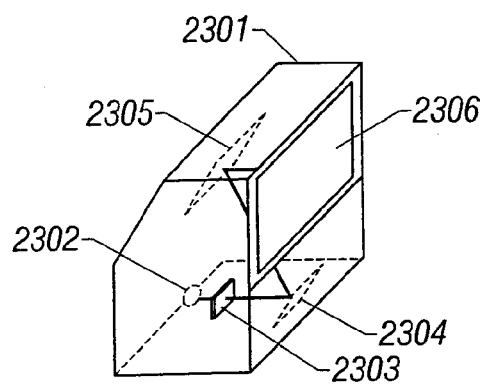

Referring to FIG. 20D, a TV projection system comprises a main body 2301, a light source 2302, a display device 2303, a mirror 2305, and a screen 2306. Because the image displayed in the display device 2303 is projected to the screen 2306, the display device 2303 must be of high resolution.

Figure 20E:
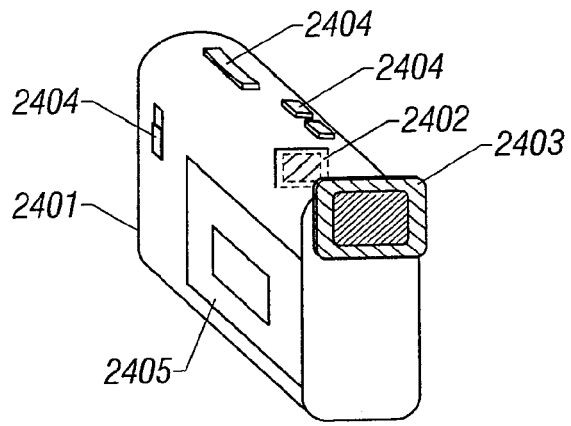

Referring to FIG. 20E, a video camera comprises a main body 2401, a display device 2402, an eye piece 2403, operation switches 2404, and a tape holder. Since the real time view of the photographed image is possible through the eye piece 2403, a user may take pictures while viewing the image.

As described above, the present invention is applicable to a wide range of fields, and is suitable for products utilizing various types of semiconductor circuits.

As compared with a conventional channel doping technology, the present invention enables a further precise control of channel doping. More specifically, the threshold voltage, which was previously controlled in the order of several volts, is now controllable in the order of several tenths of volts.

In particular, the present invention is especially effective for a TFT having superior characteristics (e.g., those having a threshold voltage with extremely small absolute value and have difficulties in controlling it); the window width, which influences not only the drive voltage of the gate electrode but also the power consumption, can be suppressed to 1 V or lower, more specifically, to a range of from 0.4 to 1.0 V.

While the invention has been described in detail, it should be understood that the present invention is not to be construed as being limited thereto, and that any modifications can be made without departing from the scope of claims.

What is claimed is:

1. A method of manufacturing a semiconductor device, comprising the steps of:
    forming a semiconductor island for an n-channel transistor on an insulating surface;
    introducing ions of a p-type impurity into only an edge portion of said semiconductor island; and
    subjecting said semiconductor island to a thermal oxidization process to form a thermal oxide film on upper surfaces of the semiconductor island while simultaneously forming the thermal oxide film on side surfaces of the semiconductor island, wherein said p-type impurity is incorporated into the thermal oxide film;
    forming a gate electrode over said portion of the semiconductor island with said thermal oxide film interposed therebetween wherein said gate electrode contacts the thermal oxide film formed on the upper and side surfaces of the semiconductor island;
    forming side walls on side surfaces of the gate electrode; and
    forming a silicide layer on a top surface of the gate electrode by a salicide technique.

2. The method of manufacturing a semiconductor device according to claim 1, wherein said ions are introduced without mass separation.

3. The method of manufacturing a semiconductor device according to claim 1, wherein said semiconductor island is for an n-channel thin film transistor.

4. The method of manufacturing a semiconductor device according to claim 1, wherein said silicide layer comprises cobalt silicide or titanium silicide.

5. The method of manufacturing a semiconductor device according to claim 1 wherein said p-type impurity is incorporated into the thermal oxide film formed on said semiconductor island.

* * * * *